United States Patent [19]

Tropp et al.

[11] Patent Number: 4,899,109
[45] Date of Patent: Feb. 6, 1990

[54] METHOD AND APPARATUS FOR AUTOMATED MAGNETIC FIELD SHIMMING IN MAGNETIC RESONANCE SPECTROSCOPIC IMAGING

[75] Inventors: James S. Tropp, Berkeley; Kevin A. Derby, S. San Francisco; K. Christine Hawryszko, Millbrae, all of Calif.

[73] Assignee: Diasonics Inc., South San Francisco, Calif.

[21] Appl. No.: 233,021

[22] Filed: Aug. 17, 1988

[51] Int. Cl.$^4$ .......................................... G01R 33/20
[52] U.S. Cl. ..................................... 324/320; 324/319
[58] Field of Search ............... 324/300, 307, 309, 318, 324/320, 319, 322

[56] References Cited

U.S. PATENT DOCUMENTS

| | | | |
|---|---|---|---|
| 4,680,551 | 7/1987 | O'Donnell et al. | 324/318 |
| 4,682,112 | 7/1987 | Beer | 324/322 |
| 4,720,679 | 1/1988 | Patrick et al. | 324/320 |
| 4,740,753 | 4/1988 | Glover et al. | 324/320 |
| 4,761,614 | 8/1988 | Prammer et al. | 324/320 |

OTHER PUBLICATIONS

MacKenzie et al, "A Simple Field Map for Shimming", Mag. Reson. in Med., vol. 5, 1987, pp. 262–268.
Doddrell et al, "Nodal Inhomogeneity Mapping by Localized Excitation—the , 'NIMBLE' Shimming Technique for High-Resolution in vivo NMR Spectroscopy", Mag. Reson. in Med., vol. 7, 1988, pp. 352–357.
Prammer et al–Journal of Magnetic Resonance 77, 40–52 (1988), "A New Approach to Automatic Shimming".
Maudsley et al–J. Phys, E: Sci.Instrum., vol. 17, 1984, "Magnetic Field Measurement by NMR Imaging"–5 pages.
Maudsley et al–Magnetic Resonance In Medicine 2, 218–233 (1985), "Filed Inhomogeneity Correction and Data Processing for Spectroscopic Imaging".

Primary Examiner—Michael J. Tokar
Attorney, Agent, or Firm—Nixon & Vanderhye

[57] ABSTRACT

An automated magnetic field shimming process for magnetic resonance spectroscopic imaging (MRSI) uses doubly phase encoded NMR spin echo responses in conjunction with multiple fourier transformation to derive a spectroscopic plot for each voxel in a three-dimensional array of voxels in an image volume (including portions of a living subject) which is to be subsequently subjected to MRSI using NMR FID or spin echo responses. The thus derived hydrogen peak frequency is taken as a measurement of existing static magnetic field intensity within that voxel and adjusted shim coil currents are calculated so as to reduce or minimize nonuniformity of the static magnetic field. A nonexistent pseudo shim coil having an assumed uniform shim contribution may enhance the resulting field homogeneity. The auto shimming procedure may be applied iteratively as required to achieve the predetermined degree of field uniformity.

47 Claims, 10 Drawing Sheets $LA \approx \frac{3\lambda}{4} @ {}^1H$ $\approx \frac{3\lambda}{16} @ {}^{13}C \approx \frac{\lambda}{4}$ $\approx \frac{3\lambda}{10} @ {}^{31}P \approx \frac{\lambda}{4}$

EXAMPLE OF PEAK PICKING ALGORITHM USING WATER

METHOD AND APPARATUS FOR AUTOMATED MAGNETIC FIELD SHIMMING IN MAGNETIC RESONANCE SPECTROSCOPIC IMAGING

FIELD OF INVENTION

This invention is related to the field of magnetic resonance imaging (MRI) utilizing nuclear magnetic resonance (NMR) phenomena and to magnetic resonance spectrographic imaging (MRSI) sometimes also known as chemical shift imaging (CSI). (MRSI is also sometimes referred to as magnetic resonance spectroscopic imaging). It is particularly related to automated magnetic field shimming techniques useful in MRI and MRSI as well as multiple-tuned RF coil structures and other method/apparatus especially useful in MRSI.

BACKGROUND OF THE INVENTION

Magnetic resonance imaging (MRI) is now in widespread commercial practice. Although magnetic resonance spectroscopic imaging (MRSI) has long been envisioned as a useful further improvement, it is still largely in the experimental laboratory and/or prototype stage of development. In part, difficulties in achieving commercially practical MRSI include the fact that only relatively small NMR RF signal responses are available from other than hydrogen nuclei in a typical animal body environment (which is typically the sort of object to be imaged). While MRI is itself a sophisticated procedure requiring careful control of many physical parameters (e.g., spatial distribution of magnetic and radio fields), MRSI requires a substantially greater degree of care and precision.

For example, in typical MRI as presently practiced, a variation in the nominally static magnetic field $B_o$ of as much as about 30 parts per million (ppm) can easily be tolerated. In fact, although commercially available cryogenic magnets for use in magnetic resonance imaging typically include a set of 12 magnetic field "shim" coils (to compensate for inhomogeneities), there is often no need to even use the shim coils for conventional MRI —over even relatively large image volumes. (It should be observed, however, that the automated shimming techniques of this invention may also find application to improve even MRI.)

However, for MRSI, the homogeneity of the nominally static magnetic field must be held to considerably greater tolerances for acceptable results. For example, where the human head is involved, we desire a total variation of static magnetic field $B_o$ over a one liter image volume of no more than 0.2 ppm (and preferably on the order of no more than about 0.1 ppm).

In MRSI, attainable signal-to-noise ratio is determined by global homogeneity over the entire image volume—even though spectral resolution is determined only by local homogeneity over a given voxel. In the past, even when global homogeneity of 1.0 ppm has been attempted using available manual techniques, it typically required an experienced NMR scientist to expend on the order of 0.5 to 1.5 hours to achieve even this level of homogeneity. Since differences in magnetic susceptibility from one patient to the next can easily cause unacceptable changes in static magnetic field homogeneity within the image volume, some sort of shimming procedure therefore becomes necessary as part of the initial setup overhead time before conventional MRSI imaging procedures can be effected.

Since subsequent MRSI imaging procedures can easily require 30 minutes or so, it can be seen that available iterative manual techniques for achieving shim current adjustments would make the overall imaging procedure time so long as to be intolerable both from the standpoint of patient endurance and any economic measure of patient throughput per machine-day. Furthermore, before MRSI can achieve widespread commercial acceptance, the procedures must be sufficiently simple and reliable to be confidently accomplished by lower level technicians rather than only by high level NMR scientists.

Typically, in commercially available static magnet structures suitable for this field, there are plural (typically twelve) so-called "shim" coils in addition to the main magnetic field producing structure (whether it be a cryogenic, resistive or permanent magnet). Each of these "shim" coils has its own non-uniform spatial distribution of magnetic field component (typically of interest only along the z-axis direction). Accordingly, by adjusting the current flow in a given shim coil, a non-homogeneous component can be added to the existing field. If the added non-uniform shimming components are properly selected, then they may largely cancel unavoidable non-uniformities included in the nominally static field produced by the main field producing structure. Since there are typically many degrees of freedom (e.g., twelve) and since the coil fields are typically not all orthogonal with respect to one another (i.e., adjusting one coil to improve one area of non-uniformity may require readjustment of other shim coil currents so as to maintain earlier achieved compensations), it can be appreciated that the typical manual iterative process that is involved in "shimming" can become a very frustrating and time consuming project in its own right.

This problem has been recognized in the art and some solutions have been proposed. In our opinion, of presently known proposals by others, the following are thought to be especially relevant to our invention.

Prammer et al, "A New Approach to Automatic Shimming", J. Mag. Res., Vol. 77, pp 40–52 (1988).

U.S. Pat. No. 4,680,551—O'Donnell et al. (1987).

Based on comments in Prammer et al (which is considered to be more relevant than O'Donnell et al.), it appears that further references 3 and 5–7 noted in that article may also be relevant to this invention.

O'Donnell et al directly measure actual magnetic field strength with a positionable probe at the outer surface of an imaginary sphere which encloses an image volume. These actual measurements outside the image volume, are used to infer magnetic field strengths within the image volume and they then use a weighted mean-square calculation algorithm for determining shim coil currents required to minimize inhomogeneity of the main magnetic field. It should be noted that the actual measurements of magnetic field are made in the absence of all shimming fields. Their technique does not appear suitable for use with an actual patient in place—and, indeed, they only report corrected inhomogeneities on the order of plus/minus 50 ppm which are clearly unsuitable for MRSI. Rather, it appears that O'Donnell et al were probably directing their efforts towards one-time factory calibration of shim current coils for traditional MRI.

Prammer et al., on the other hand, do specifically direct their attention to automatic shimming for improvement of chemical shift imaging. They use a modified Fourier imaging technique to quickly derive a simple phase measurement for each voxel to be shimmed. In effect, the phase difference between two spin echoes having slightly different time delays is measured—during which time delay nuclear phase shifts proportional to the static field are accumulated. Accordingly, the difference between the measured phases should be a function of the actual magnetic field—and thus should permit mapping of field inhomogeneities. Taking this as a given, Prammer et al. then use previously acquired differential field distribution data for each of the shim coils in conjunction with an appropriate calculation algorithm (Chebychev or Least-Square criterion) to calculate adjusted shim coil currents for reducing or minimizing resultant composite static magnetic field variations within the image volume. It should be noted that the field mapping method of Prammer et al requires a readout gradient much stronger than the largest field gradient of the unshimmed field.

Although the Prammer et al field mapping technique by use of a relatively simple and quickly acquired phase data set theoretically supplies the required information in a fairly short time (they report about 1 minute per plane), even Prammer et al. specifically note that their results produce apparent field differences that are inherently indistinguishable from chemical shift frequency changes produced by different NMR species. For example, the NMR response from human tissue typically includes water and fat as two major components of NMR species. Although Prammer et al. specifically state that "precautions must be taken for separating data points where lipid signal dominates over the water peak," they offer no suggestion as to how this is to be accomplished. Furthermore, they report only data taken with respect to a phantom having uniform density and distribution of NMR species.

Although Prammer et al. specifically recognize that it has long been known that chemical shift imaging may be used to map the inhomogeneity of the static magnetic field (citing to Maudsley), Prammer et al. specifically teach away from such mapping for automatic shimming purposes as it is "inherently slow, because it is inefficient to collect a spectrum at each spatial point in order to derive a single scalar value (the magnitude of the local field)."

SUMMARY OF THE INVENTION

However, contrary to Prammer et al., we have discovered a practical automatic shimming process and apparatus which nevertheless utilizes chemical shift imaging of hydrogen nuclei (i.e., protons) to map the static field inhomogeneities used in conjunction with earlier derived calibration matrixes for the shim coils so as to derive adjusted shim coil currents which will reduce or minimize inhomogeneties in the resultant composite static magnetic field.

We have discovered the availability of an entire NMR frequency spectrum data set for each voxel to be shimmed to be a decided advantage since there typically can be rather strong NMR signal responses which are frequency shifted relative to water and/or due to non-uniform structural areas (such as human sinus areas where the frequency spectra peaks may be quite broad or even split).

In our presently preferred exemplary embodiment, we provide an automated "peak picking" algorithm (possibly coupled with an operator interface for hard choices) so as to reliably and accurately ascertain the water peak frequency for a given voxel—or to simply not include that particular voxel as a grid point in the shimming algorithm. In one typical exemplary embodiment of our invention, we map the distribution of the existing static magnetic field $B_o$ within an imaging volume (typically with a first set of approximated shim currents $I_1 \ldots I_n$ already passing through shim coils $S_1 \ldots S_n$). As just explained, such mapping is achieved by magnetic resonance spectroscopy so as to accurately map the frequency of a predetermined NMR species at an array of voxel locations within the image volume.

An adjusted set of shim coil currents $AI_1 \ldots AI_n$ is then machine calculated using a calibration matrix of $B_z$ field distributions produced by the individual shim coils together with the spectroscopically measured existing $B_o$ field distribution so as to minimize variations therein. These adjusted shim coil currents are then applied to the corresponding shim coils and, if sufficient homogeneity is not yet then achieved, the entire process is repeated.

So as to insure that the image volume of interest is being properly shimmed, we also prefer to have at least one magnetic resonance "locator" image created prior to the shimming procedure and used by an operator to define the desired image volume over which the $B_o$ field distribution is to be shimmed for homogeneity.

Since the inhomogeneous magnetic susceptibility of the patient tissue to be imaged itself creates some of the inhomogeneity in a static magnetic field which is to be compensated, we prefer to perform the shimming procedure while a living patient is located within the image volume—and to maintain the living patient in a relatively fixed location therewithin throughout the entire shimming and subsequent MRSI procedure. To facilitate this sequence, a multiply-tuned set of RF coils is used to couple NMR RF signals to/from the image volume for different NMR species without requiring changes in physical configuration of the system (including the patient) even though the shimming procedure itself may actually utilize only NMR responses from a single NMR species (preferably hydrogen nuclei due to their much greater concentration in typical living tissue).

We prefer to use spin echo NMR responses during the shimming procedure since spin echoes inherently eliminate spurious phase accruals due to background magnetic field inhomogeneities during the phase encoding pulses. Such inhomogeneous phase accruals may otherwise lead to detrimental errors in the resultant shimming process since it must be assumed that the initial field distribution in a shimming procedure may be quite poor (after all the whole purpose of the shimming procedure is to make a rather poor distribution much better).

We therefore much prefer the use of spin echo NMR data for the shimming procedure itself since spin echo data is relatively insensitive to field inhomogeneities. On the other hand, for actually measuring NMR spectra of other species (e.g., $13_C$ or $31_P$), we currently prefer the use of NMR FID RF responses (e.g., due to typically better FID signal-to-noise properties of these relatively sparser populations of NMR nuclei). As will be understood, MRSI using spin echo responses may also be feasible or desirable (e.g., for $^{13}C$ or water-suppressed $^1H$ MRSI).

The calibration matrix may be generated by individually changing the current flowing in each of the shim coils, then measuring and recording the resultant distribution of incremental changes in the $B_z$ field per unit change in the shim current for a given shim coil.

We have also discovered that improved uniformity in the auto-shimming procedure can be achieved by including a non-existent pseudo-shim coil having an assumed spatially uniform distribution of incremental field contribution per unit current and calculating the corresponding pseudo-current for that coil. Even though no such coil and no such current are actually therefore used, it does permit the least squares procedure used in the exemplary minimization calculation to include a uniform offset $B_z$ field component. Since the homogeneity of the resulting $B_o$ field is of the highest importance (and the actual value of that field of much much less importance), this artifice provides a useful feature.

In our preferred embodiment, the RF probe includes two pairs of RF Helmholtz coils. Each pair is orthogonal to the other pair and is tuned to resonate at frequencies corresponding to different NMR species (e.g., $^{31}P$ and $^1H$ respectively). Each coil of a given pair is capacitively coupled to the other—and the pair is itself inductively coupled via its own RF fields to its own proximately located input/output loop. The differently tuned Helmholtz coil pairs are then coupled (via their I/0 loops) to a common transmit/receive input/output port via a passive frequency multiplexer in the exemplary embodiment. A quick acting transmit/receive switch is effectuated by judicious choice of a PIN diode shorted transmission line having an effective length of an odd multiple of quarter wavelengths at all the principal frequencies of interest.

BRIEF DESCRIPTION OF THE DRAWINGS

These, as well as other objects and advantages of this invention will be more completely understood and appreciated by careful study of the following detailed description of a presently preferred exemplary embodiment of this invention taken in conjunction with the accompanying drawings, of which.

DETAILED DESCRIPTION OF A PREFERRED EXEMPLARY EMBODIMENT

Figure 1:
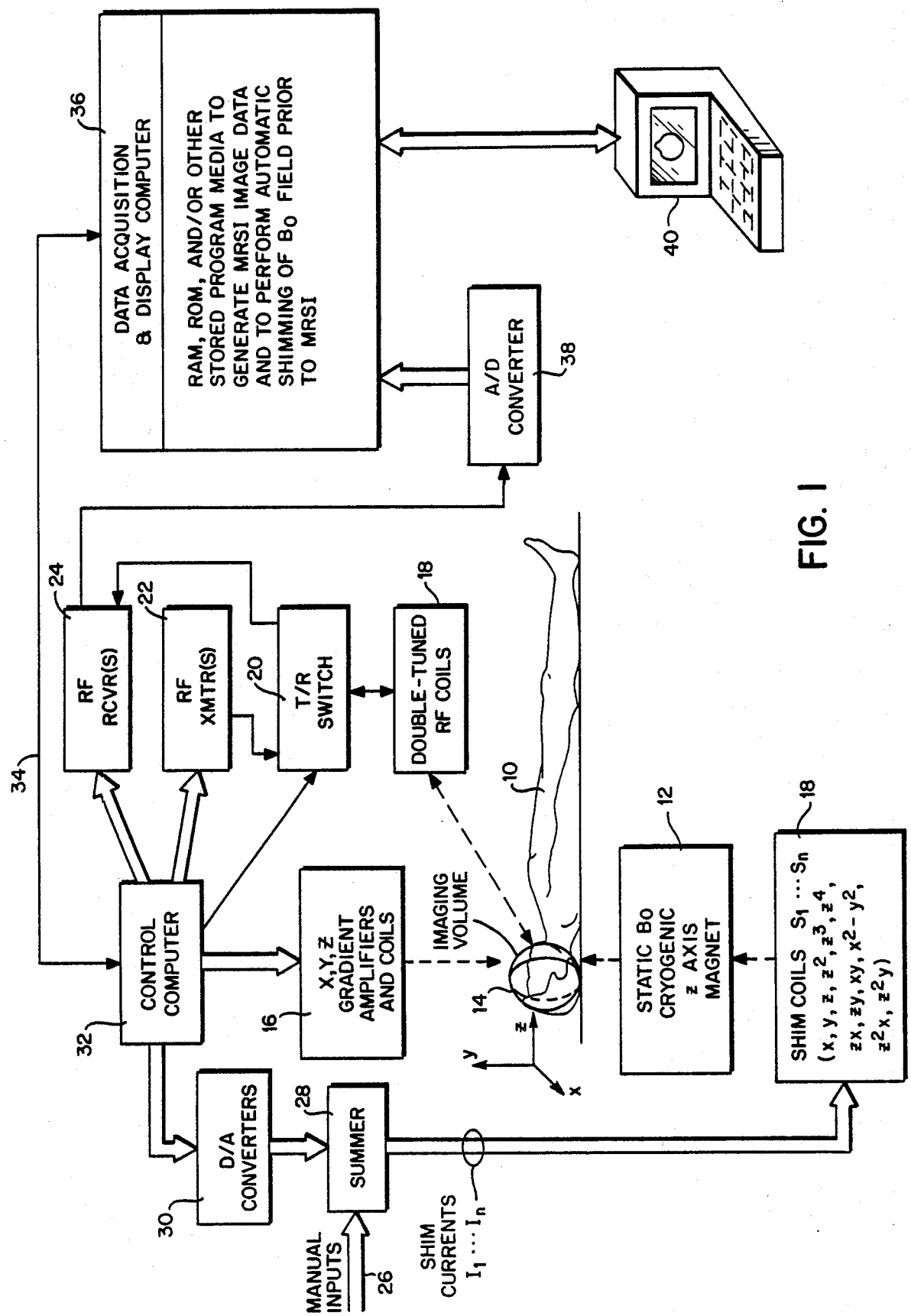
FIG. 1 is a simplified general block diagram of an exemplary embodiment of this invention.

The novel signal processing features utilized by this invention can, at least in part, be achieved by suitable alteration of stored controlling computer programs in existing MRI and/or MRSI apparatus. As one example of such typical apparatus, the block diagram of FIG. 1 depicts the general architecture of a typical MRI/MRSI system. Except for the drive arrangement to the shim coils and for the multiple-tuned RF coils and feed structure (all of which are described in more detail below), the remainder of the FIG. 1 system may be realized by suitably reprogramming existing systems. As will be understood by those in the art, once such novel controlling computer programs are physically installed and under execution, they correspond to specific physical structures associated with particular operational functions of the system.

Typically, a human or animal subject (or other object) 10 is inserted along the z-axis of a static magnet 12 which establishes a nominally uniform magnetic field $B_o$ directed along the z-axis within at least the imaging volume 14 encompassing a portion of the object to be imaged. Gradients may be imposed within this z-axis directed magnetic field along the x,y or z axes by a set of x,y,z gradient amplifiers and coils 16. NMR RF signals are transmitted into the body 10 and NMR responses are received from the body 10 via multiple-tuned RF coils 18 via a transmit/receive switch 20 and RF transmitter circuits 22 and RF receiver circuits 24. Typically, conventional magnets 12 may come with multiple shim coils 18 (e.g., twelve) which may be controlled by suitable shim currents $I_1 \ldots I_n$ to improve the homogeneity of the static field $B_o$ within the imaging volume 14. The shim currents are individually controlled by manual inputs 26 respectively summed in summer 28 with the outputs of D/A converters 30 for each of the shim coils.

All of the prior mentioned elements may be controlled, for example, by a control computer 32 which conventionally communicates via bus 34 with the data acquisition and display computer 36. The latter system 36 may also receive NMR RF responses via an analog-to-digital converter 38. A CRT display and keyboard unit 40 is typically also associated with the data and acquisition display computer system 36.

As will be apparent to those in the art, such an arrangement may be utilized so as to generate desired sequences of magnetic gradient pulses and NMR RF pulses and to measure desired NMR RF responses in accordance with stored computer programs. As depicted in FIG. 1, the MRI/MRSI system of this invention will typically include RAM, ROM and/or other stored program media adapted (in accordance with the following descriptions) so as to generate phase encoded spin echoes and/or FID RF signals during each of multiple measurement cycles and to process the resulting MRI/MRSI data into final high resolution images. In this particular invention, such programs also perform automatic field shimming of $B_o$ prior to the actual MRI/MRSI imaging procedures.

The overall goal of a typical MRSI system may be, for example, to perform in vivo $^{31}P$ spectroscopy on humans. This means that plots of phosphorus NMR signal intensity versus NMR frequency are to be obtained from voxels (i.e., volume picture elements) with well-defined anatomical locations. Such a plot of accumulated data may be displayed individually for a given voxel as in FIG. 11—or may be appropriately segregated and converted to gray or color scales and displayed in raster scanned format on a CRT screen as a visual image of the spatial distributions or concentrations of a given NMR species within a defined cross-section of the human body.

Figure 11:
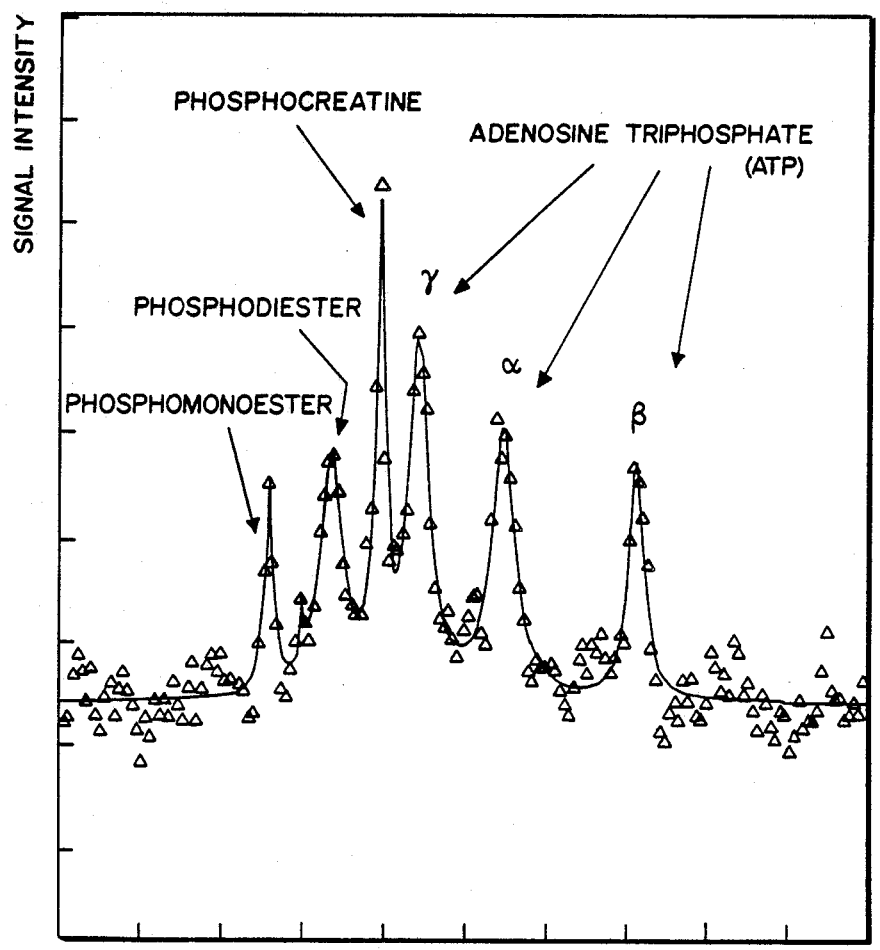
FIG. 11 is a plot of the $^{31}P$ spectrum obtained from a 27 cubic centimeter voxel in a normal human brain, after exponential filtering and base line correction in accordance with conventional MRSI.

For example, from a plot such as shown in FIG. 11, it is possible to estimate the concentration of various phosphorus containing metabolites (ATP, phosphocreatine, etc) which are of medical interest. In FIG. 11, the triangles are actual data points while the drawn curve is fit to that data. In the spectrum as shown, peaks corresponding to several compounds are clearly visible as labelled in the drawing.

The general MRSI techniques used to obtain such plots or spectra (which techniques are sometimes also known as chemical shift imaging) may take various specific forms. In the presently preferred exemplary embodiment, the technique first proposed by Brown et al. under the name of "Chemical Shift Imaging" and by Maudsley et al under the name "Four Dimensional NMR" is utilized. Here, phase encoding magnetic gradient pulses are employed in both the x and y dimensions such that after a two-dimensional Fourier Transformation with respect to the phase encoding gradients, one obtains time domain NMR transients from individual voxels. A further dimension of Fourier Transformation of these time domain transients then yields frequency spectra associated with individual voxels as depicted in FIG. 11. Since those in the art are already familiar with various MRI and/or MRSI procedures of this type, and since this invention is primarily directed to processes carried out prior to such conventional MRI and/or MRSI procedures of this type, no further description of such is believed necessary.

Since the NMR frequency at which a given species of nuclei resonates is proportional to the magnitude of magnetic field at its specific unique location, it follows that the width of peaks in an MRSI spectrum for a given voxel will be directly related to the homogeneity of the $B_o$ field within that voxel. In general, the more homogeneous the field, the sharper the spectral peaks. The need for sharper peaks is especially critical with low signal-to-noise ratios—as may be typically expected with NMR species other than hydrogen in a typical human body environment. In our exemplary embodiment, we prefer to have field homogeneity on the order of 0.2 parts per million (ppm) root mean square (RMS) over the image volume.

To counteract existing inhomogeneities in the $B_o$ field, conventional cryogenic magnets used in this environment are typically equipped with a set of twelve inductive coils commonly known as "shim" coils and denoted $S_1 \ldots S_n$ in FIG. 1. Such coils are commercially available, for example, as the Oxford resistive shim set. The shim coils are wound on a dielectric cylinder running along the bore of the magnetic and each coil is designed to produce field along the z-axis which varies as a spherical harmonic. The principal spatial dependence of each shim coil contribution is typically used as the "name" of a given shim coil and the conventional twelve coil set names are depicted in box 18 at FIG. 1.

The use of spherical harmonics to describe electromagnetic field distributions is quite common because spherical harmonics are solutions to the angular portion of the Laplace equation when expressed in spherical polar coordinates. Since (in magnetostatics) each component of the magnetic field must satisfy the Laplace equation, we can therefore expand an arbitrary $B_z$ distribution in terms of its spherical harmonics $Y_{lm}$ as:

$$B_z(r,\theta,\phi) = \sum_{l=0}^{\infty} \sum_{m=-l}^{l} [A_{lm}r^l + B_{lm}r^{-(l+1)}]Y_{lm}(\theta,\phi)$$

For solutions which are non-singular at the origin, the $B_{lm}$ terms are all zero and one need only treat the $A_{lm}$ terms. In this case, $B_z$ is approximately equal to $B_o$ plus $A_{10}z$ plus higher order terms. Changing currents in the shim coil set essentially corresponds to changing the $A_{lm}$ terms. To make the composite resulting static field $B_o$ components in the z direction as homogeneous as possible, then all $A_{lm}$ terms having l greater than zero should be made as close as possible to zero so as to leave only the static $B_o$ term. This process of adjusting the shim coil current set so as to achieve maximum uniformity within the image volume 14 is generally known as "shimming."

Because of the extreme requirements for homogeneous magnetic field in MRSI, it has been discovered a practical necessity to adjust the field homogeneity for each specific anatomical structure to be imaged (e.g., each time a different patient is placed on the apparatus for an MRSI scan).

Although, as noted above, there have been other proposals for auto-shimming procedures, the only practical solution used heretofore in our laboratory required the individual manual adjustment of twelve potentiometers controlling the shim current coil set while watching a proton NMR transient from an entire slice which was later to be imaged. The subjective criteria used by an NMR scientist performing this shimming procedure so as to judge homogeneity were the overall signal amplitude of the transient (related to the amount of tissue contributing to the signal) and the decay constant of the transient (indicating the uniformity of the field over the volume contributing). As previously noted, only a highly trained individual has any reasonable or practical chance to converge this process to a set of shim currents close to a required configuration so as to minimize field variation within the volume of interest. Furthermore, such manual procedures are lengthy and frustrating for both the operator and the scan subject—and when finished, provide no guarantee that the shimmed field was in fact uniform to the desired degree over the region of interest.

We have discovered, and now demonstrated in actual practice within our laboratory, a workable and practical auto-shimming process and apparatus as depicted and described herein. In general, it involves:

1. Preferably (although not necessarily) making a set of standard MRI "locator" images so as to more accurately define the actual image volume over which the shimming procedure is to be performed.
2. Using proton MRSI to map the then existing field inhomogeneity (preferably with the shim coil current set already adjusted to some approximate degree of uniformity) by determining the position of a water peak in the NMR frequency spectrum from each voxel to be eventually employed in the auto-shimming algorithm. Although we specify the use of the water peak above, any other readily identifiable peak would serve. For example, we have used the fat peak in applying the auto-shimming procedure to human legs.
3. Using a calibration matrix of previously determined $B_z$ field distributions from each of the shim coils to be employed (not all need be employed) so as to calculate (e.g., with a least squares fit) the adjustment or change in shim currents required to minimize the RMS variation of the $B_z$ field over the volume of interest.
4. Applying the adjusted or corrected shim current set as thus calculated by use of digital to analog converter circuits under control of the computer and then to reiterate the prior two steps as required (or as desired by operator interface judgements) to achieve sufficient magnetic field homogeneity (e.g., no more than 0.2 ppm variation over the volume of interest).

Moving the patient or RF coils after the field has been properly shimmed for homogeneity should be expected to result in degradation or loss of that homogeneity. Therefore, we prefer to use at least double-tuned RF coils which can operate at both the proton NMR frequency (e.g., at about 85 MHz in a two Tesla field) and at the phosphorous frequency (about 35 MHz in a two Tesla field). The proton-tuned portion of the coil circuit is used for creating the initial MRI locator images and proton MRSI field maps used for the auto-shimming procedure. Then, when the field is sufficiently shimmed, the phosphorous-tuned coil circuit may be utilized to obtain phosphorous MRSI spectra.

Many others have addressed the fabrication of double-tuned RF coil structures for MRI in vivo. See, for example, Fitzsimmons et al, Magnetic Resonance in Medicine, Vol. 5, page 471, 1987, for a review. However, in our exemplary embodiment, we prefer a novel form of double-tuned coil probe (e.g., for the human head) as depicted at FIGS. 2–5. This probe produces quality $^{31}P$ spectra as well as $^1H$ locator images—and permits switching between these NMR species with no cable changes.

Figure 2:
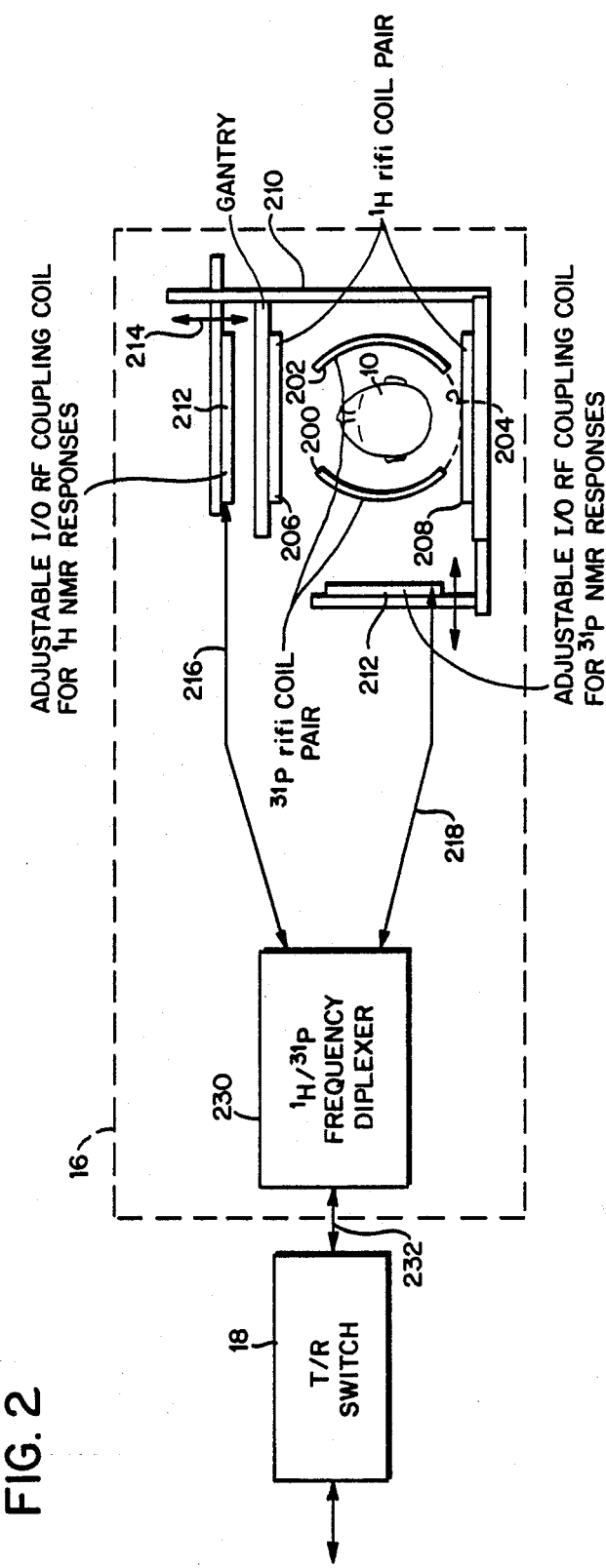
FIG. 2 is a schematic and block diagram of the doubly-tuned RF coil structure (including frequency diplexer) used in the embodiment of FIG. 1.

FIG. 2 depicts the double-tuned RF coil set 16 with the patient in place as viewed down the z-axis in cylindrical coordinates. It includes orthogonal resonators for the $^{31}P$ and $^1H$ species. Each resonator includes a pair of over-coupled tank circuits in Helmholtz geometry. For example, the $^{31}P$ Helmholtz pair 200, 202 are conformed to a circular arc on a dielectric cylinder 204 having an inside diameter of approximately 8 inches. A sector of 60 degrees is cut out of 204 to accommodate the patient's face. $^{31}P$ RF coil pair 200–202 is thus positioned and conformed as close as possible to the NMR signal sources within the patient 10 so as to maximize the available signal-to-noise ratio. For the more populous $^1H$ NMR species, a further coil pair 206, 208 is arranged orthogonally on support gantry 210. Each of these Helmholtz resonant pairs of coils extends approximately six inches in the z dimension (perpendicular to FIG. 2) and intercepts an azimuth of approximately 120°. A coupling coil loop (one turn) 212 is adjustably positioned (as depicted by arrows 214 with respect to the $^1H$ Helmholtz pair. It is adjustably positioned so as to achieve an approximate 50 Ohms impedance match to a conventional 50 ohm coaxial cable transmission line 216 for RF input/output of NMR RF signals to the coil pair 206, 208.

Similarly, a coupling loop 212 is adjustably positioned with respect to the $^{31}P$ Helmholtz coil pair for matched impedance coupling via coaxial transmission line 218 of NMR RF signals for this NMR species. Accordingly, the coupling apparatus is completely outside the patient and coil areas proper while still permitting each of the resonators to be individually matched to the transmission line impedance (e.g., 50 ohms (by adjustable inductive loading coils)) and these plural RF ports are then combined in a passive frequency diplexer 230 from which a single cable 232 runs to the transmit/receive port of the MRI/MRSI imager transmit/receive switch 18.

Figure 3:
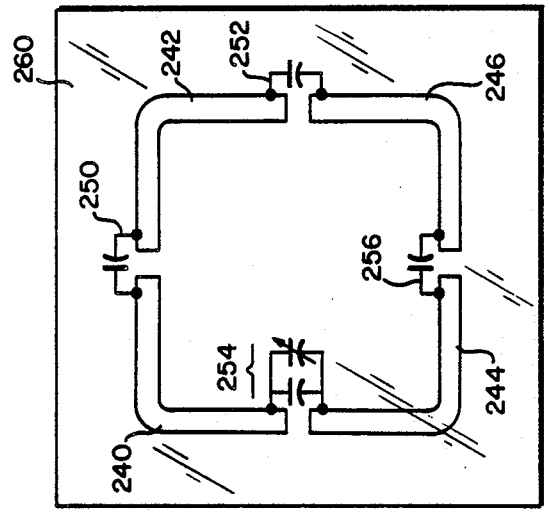
FIG. 3 is a simplified partially schematic view of a typical single-tuned coil of a Helmholtz coil pair utilized in FIG. 2.

Each individual coil of each Helmholtz pair in the exemplary embodiment includes an approximately six inch square mesh as depicted in FIG. 3. Here, the copper foil is divided into four equal 90° segments 240, 242, 244 and 246 which are coupled together for series resonance by capacitances 250, 252, 254 and 256 (at least one of which typically includes a variable element so as to fine adjust the actual final resonant frequency of the coil). The entire structure is either formed on a dielectric substrate 260 (which is then supported directly or indirectly by gantry 210) or conformed directly to dielectric cylinder 204. The adjustable coupling coils 212 are of similar size and shape albeit the copper loop is uninterrupted except at the feed point and the respective mounting substrates are mounted for adjustable positioning on gantry 210.

Figure 4:
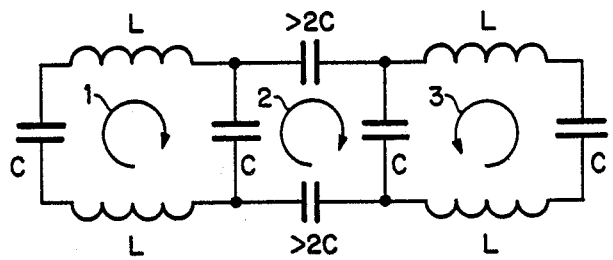
FIG. 4 is a schematic equivalent circuit diagram for a tunned Helmholtz coil pair as used in FIG. 2.

A schematic equivalent circuit of a given resonant pair of Helmholtz coils as used in the exemplary embodiment of FIG. 2 is depicted at FIG. 4. Here, the meshes 1 and 3 represent the relevant Helmholtz pair (which may be visualized by mentally cutting and folding the Figure into a "U" shape). Mesh number 2 represents capacitive coupling provided between the Helmholtz pair.

The circuit of FIG. 4 has two normal modes. The first, symmetric, mode resonates near the series resonance of LC and produces mesh currents in the direction depicted by arrows 1 and 3 in FIG. 4. Although these may appear to be counter-rotating in FIG. 4, they are actually co-rotating in the 3-D Helmholtz geometry of FIG. 2. A second, asymmetric, resonant mode is also possible but it produces actual counter-rotating currents in the 3-dimensional geometry. Only the symmetric mode produces useful B field in the image volume bounded by a given Helmholtz pair. Possible contamination by the non-symmetric mode is minimized by pulling its frequency as far a possible out of range by making a coupling capacitance 2C relatively large. For example, by making these coupling capacitors at least twice the resonating capacitance value (as depicted in FIG. 4), the asymmetric mode frequency is lowered by up to 20% relative to the symmetric mode. Grist and coworkers (Grist et al, Book of Abstracts, SMRM 1986 volume 2, page 187, 1986) have used this splitting of frequencies to make a double-tuned surface coil. Although their application differs from ours, similar principles apply.

Figure 5:
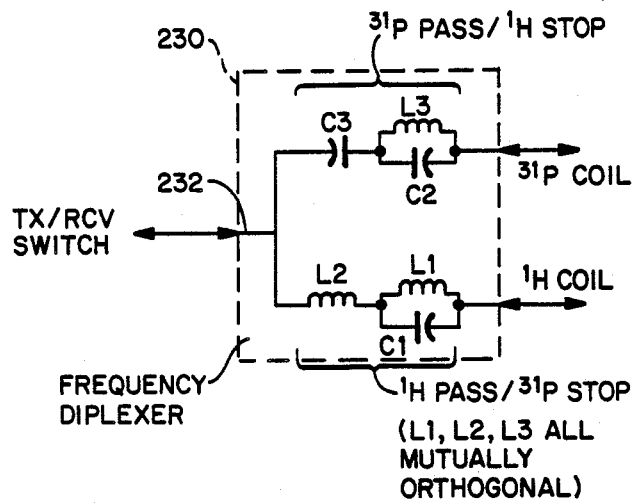
FIG. 5 is a schematic diagram of the frequency diplexer utilized in FIG. 2.

The frequency diplexer 230 is shown in more detail in FIG. 5. As may be seen, the two probe channels are combined with two pairs of pass-stop filters appropriately tuned so as to pass only the frequency of interest along a given channel from a common RF input/output port 232. This eliminates cable changes during frequency switching. In the exemplary embodiment, L1 and C1 resonate at 34.5 MHz while L2 and C1 resonate at 85.5 MHz. Similarly, L3 and C2 resonate at 85.5 MHz while L3 and C3 resonate at 34.5 MHz. The entire diplexer circuit is mounted in a copper box and has no trimmers. Each of the coils L1, L2 and L3 are mutually orthogonal to the remaining two coils. The insertion loss for $^{31}$P NMR signals is below $^{0}$.0ldb (as measured with a Hewlett Packard Model 8753 Network Analyzer) while the $^{1}$H insertion loss has been measured as about 0.2db.

As already explained, a multiply-tuned RF coil is used in the exemplary embodiment to minimize examination time and to maintain accuracy of spatial information (e.g., with respect to the auto-shimmed image volume). However, careful consideration should also be taken in the design of the RF pre-amplifier and receiver protection circuitry as well so as to minimize insertion loss at the different NMR species frequencies.

Figure 6:
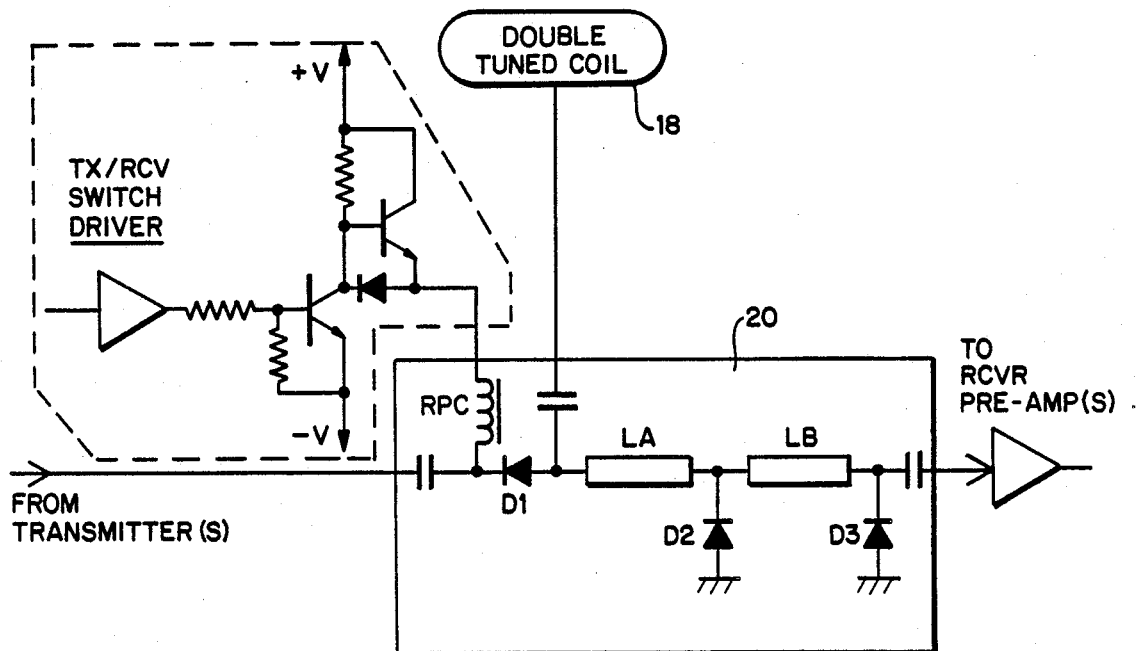
FIG. 6 is a schematic diagram of the transmit/receive switch (and driver) depicted in block diagram form at FIGS. 1 and 2.

The presently preferred low-loss multi-band receiver protection circuit for the exemplary embodiment is depicted at FIG. 6. It operates at both proton and phosphorus frequencies at two Tesla strength magnetic fields. The primary components of the circuit are semirigid coaxial cables LA and LB and actively biased PIN diodes D1, D2 and D3. For completeness, a suitable transmit/receive switch driver is also schematically depicted at FIG. 6.

The key element of the FIG. 6 circuit is transmission line LA which acts as an isolation element between the transmitter and receiver ports. LA is chosen to be three-fourths wavelength at the $^{1}$H NMR frequency (e.g., 85 MHz at two Tesla field strength). Conveniently, this also corresponds to approximately one-fourth wavelength at other NMR species of interest. For example, it is approximately three-sixteenths wavelength for $^{13}$C (21 MHz at two Tesla field strength) and approximately three-tenths wavelength for $^{31}$P (34.5 MHz at two Tesla field strength).

This approximately odd multiple of quarter wavelength provides relatively high impedance at the transmitter end of the cable for frequencies between 80 and 90 MHz while simultaneously providing relatively high impedances at the transmitter end of the cable for frequencies between 20 and 35 MHz when the shunt diodes are forward biased, and thus provides low reflection during the transmitting period for both bands of frequencies. The two shunt PIN diodes D2 and D3 are slightly spaced apart by a further transmission line LB (e.g., 40 centimeters) which corresponds to the electrical length of approximately 0.04 wavelength to 0.18 wavelength over the frequency range of 20 MHz to 90 MHz. The spaced shunt diode configuration improves the isolation which can be achieved over that of a single diode switch as will be appreciated by those in the art (e.g., see Microwave Associates Inc, PIN Diode Designers Guide, Microwave Associates, Burlington, Mass., pp. 21-24).

The PIN diode driver depicted in FIG. 6 is a known bi-polar design with active pull-up for fast switching (e.g., see White, J.F. "Microwave Semiconductor Engineering", Van Nostrand Reinhold Co., Inc, New York, 1982 pp 122-123). The DC bias current for the shunt PIN diodes D2, D3 is supplied from the transmitter side through series PIN diode D1 so as to avoid additional insertion loss caused by the RFC of PIN diode driver circuit.

Insertion losses with the circuit of FIG. 6 have been measured as approximately 0.12db and 0.25db for phosphorus and proton frequencies respectively (at two Tesla field strength). Required switching times are less than 5 microseconds at both frequencies.

Figure 7:
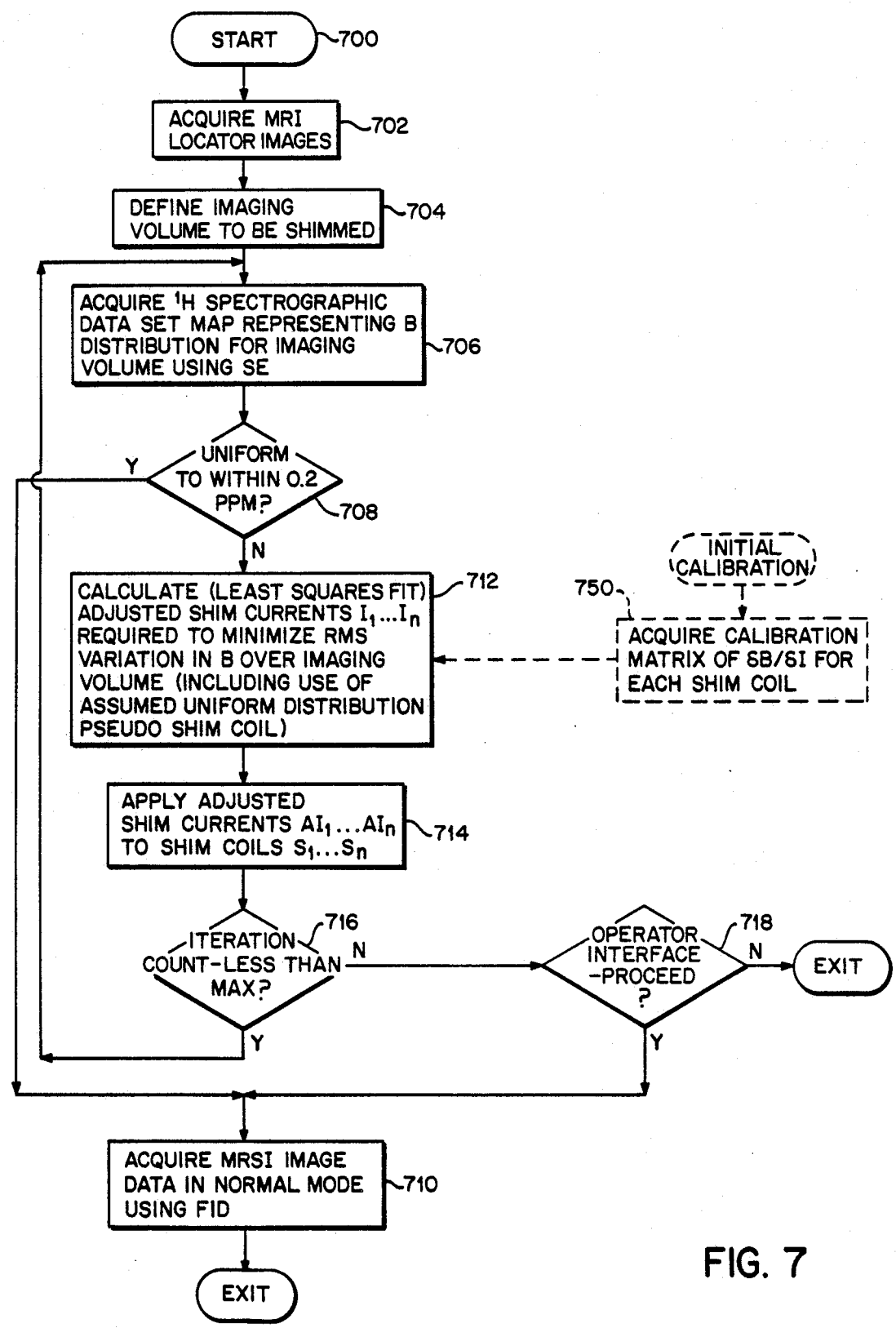
FIG. 7 is a flowchart of a suitable computer program which may be used in the system of FIG. 1 to effect an exemplary auto-shimming process.

A suitable computer program for the exemplary system of FIG. 1 is depicted at FIGS. 7 and 8. Here, at 700, entry to the auto-shimming sub-routines is taken (typically under an operator controlled branch) and conventional MRI images are acquired at 702 so as to serve as "locator images." Since these images have by definition been taken within the three-dimensional coordinate system of the MRI/MRSI apparatus, an operator can view the images and denote accurately within the established coordinate system a particular image volume 14 in which MRSI is subsequently to be performed—and for which auto-shimming is therefore desired.

Once the image volume 14 has been suitably defined within the existing coordinate system, then proton MRSI is utilized at 706 so as to acquire proton spectrographic data sets constituting a map of the actual then existing $B_z$ field distribution within the imaging volume. As previously noted, (and as will be explained in more detail below), the acquisition of proton spectrographic data at 706 is preferably achieved using spin echo NMR responses.

In the preferred exemplary embodiment, we use a three-slice, two spin echo average protocol. That is, three volumetric "slices" are used to spatially sample the existing field distribution within the image volume 14. A suitable MRSI sequence is employed so as to obtain two proton NMR spin echo responses for each of the numerous phase encoded sequences. These two spin echoes are then averaged together before multi-dimensional Fourier Transformation is used to produce NMR spectra for all of the voxels within each of the three slices being sampled by this protocol.

In the exemplary embodiment, auto-shimming is performed with a voxel size which is relatively large (e.g., in comparison with voxel sizes possibly later used for MRI). For example, in the exemplary embodiment, only 16 phase encoding steps are employed in both the x and y directions thus producing a map of $3 \times 16 \times 16 = 768$ voxels distributed over the three-dimensional image volume. This arrangement has been found suitable, for example, for shimming image areas within human heads. Here, the actual voxel size is about one centimeter on a side with the three slices being spaced at approximately two centimeter intervals. Since the cross section of a human head is typically on the order of about 100 square centimeters, the actual shimming algorithm typically employs a grid of roughly 300 elements. Using the two average spin echo protocol, the actual data acquisition time for acquiring this sort of proton map data presently requires about 8 minutes—although this might be effectively cut in half by using a single spin echo rather than two.

As previously noted, the use of spin echo data for shimming purposes is preferred since it eliminates spurious accrual of phase caused by background $B_o$ inhomogeneities during the phase encoding pulses. Such accrual can lead to position errors in the shimming process and thus be detrimental. It is sometimes said that phase encoding is insensitive to $B_o$ inhomogenetities—but this is only true if one uses spin echo rather than FID NMR data. Especially because the initial field homogeneity in the auto-shimming procedure may be quite poor (at least relative to the desired homogeneity for MRSI purposes) we prefer to use an imaging method in the auto-shimming process itself which is relatively less sensitive to field inhomogeneities.

Figure 9:
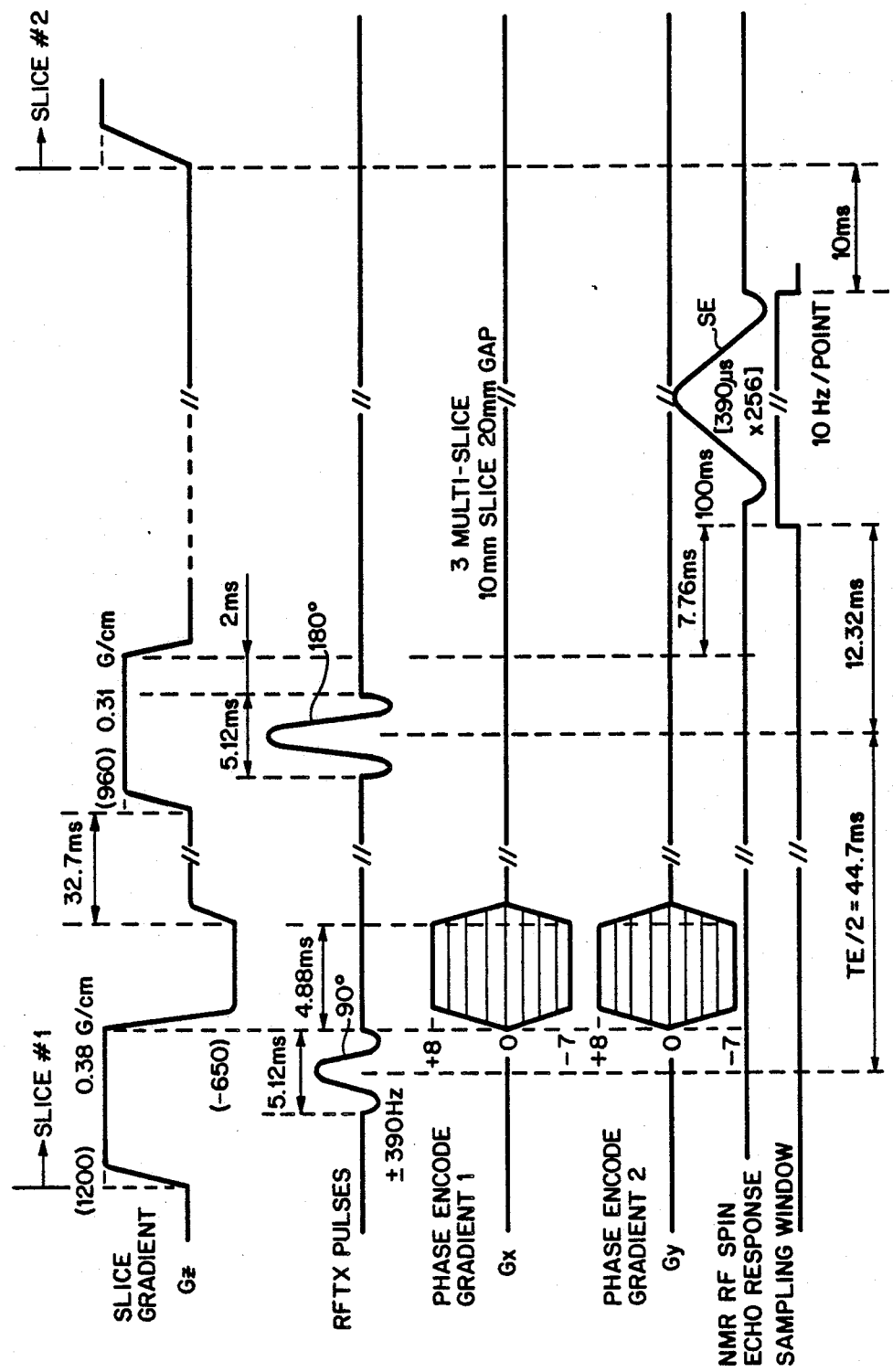
FIG. 9 is a timing diagram of magnetic gradient and RF transmit pulses used in the exemplary embodiment to acquire non-frequency encoded NMR spin echo responses for use in the auto-shimming process and apparatus of the prior figures.

Since the acquisition of MRSI data using various protocols (including multi-slice average spin echo protocols) is relatively well-known in the art, it is not believed necessary to describe it in great detail. However, a schematic time diagram of a typical acquisition sequence for a given slice is depicted at FIG. 9. This particular sequence is dimensioned for a three multi-slice procedure wherein each slice is approximately 10 millimeters wide and separated by approximately 20 millimeters from the adjacent slice. Within each slice, the 16 step phase encoding in both x and y dimensions produces a 16×16 array of voxels each having dimensions of approximately 12 millimeters by 12 millimeters.

Figure 10:
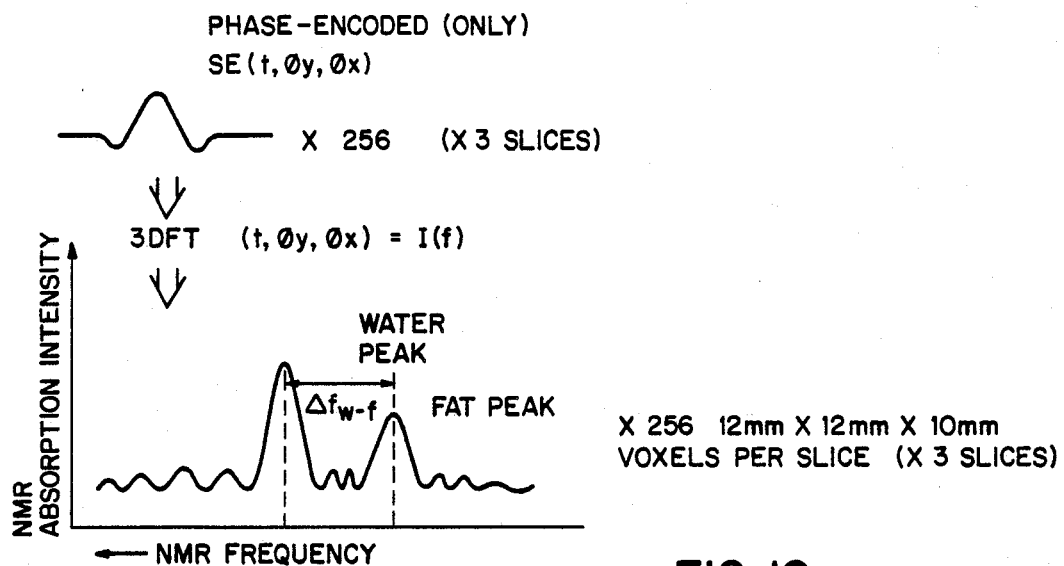
FIG. 10 is a graphical and schematic diagram depicting the process by which non-frequency encoded spin echo NMR data is converted to an accurate measurement of field intensity for a given voxel to be shim adjusted within the image volume of the FIG. 1 system.

As will be appreciated from FIG. 9, phase encoding is accomplished without the use of any gradient during readout of the spin echo. Multi-slice data gathering procedures are used (with each slice being selected by a z-axis gradient) and two dimensions of phase encoding so as to image several planes. These phase encoded spin echo data are schematically depicted at FIG. 10. They are three dimensionally Fourier Transformed (with respect to both degrees of phase encoding and with respect to the time domain) so as to produce an NMR absorption intensity spectrum for each voxel used in the auto-shimming procedure. This is depicted in FIG. 10. It is, of course, possible to dispense with the usual multi-slice procedure and add a third direction of phase encoding (using the z-axis gradient). This would require four dimensions of Fourier Transformation rather than only three to achieve the desired spectrum for each voxel as depicted in FIG. 10.

Actually, for the auto-shimming purposes of this invention, it is not necessary to actually produce a final classical absorption spectrum. For example, this typically requires an appropriate phase correction to be applied by the operator so as to produce the familiar absorption mode signals of linear response theory. For auto-shimming, this correction may be made unnecessary by simply plotting the magnitude of Fourier Transformed frequency data (as is actually depicted in FIGURE 10). If a distinction is required, we will hereafter refer to "phase sensitive" or "absorption mode" spectra to distinguish from the simplified magnitude spectra depicted in FIG. 10 and actually used in the exemplary auto-shimming procedure. The use of magnitude spectra is important in our exemplary embodiment since it permits rapid machine-computed generation of an unambiguous field map without operator intervention.

As earlier explained, the NMR frequency of a particular NMR species may be taken as a measurement of the actual B field then existing within the voxel whose spectrum is being reviewed. Accordingly, as depicted in FIG. 10, if the frequency of the water (i.e., proton) peak is consistently acquired for each voxel in the auto-shimming procedure, then this map or matrix of water peak frequencies may be taken as a measurement of magnetic field strength within the image volume. The relative degree of homogeneity may then be calculated at 708 and if uniform to within an acceptable limit (e.g., 0.2 ppm), then one may proceed directly to conventionally acquire MRSI image data at 710 (e.g., in a conventional mode using FID NMR response signals). On the other hand, if sufficient field homogeneity is not present, then an adjusted set of shim currents is calculated at 712 (e.g., using a least squares fit and earlier acquired calibration matrix data for each shim coil) as required to minimize the RMS variation in the B field over the imaging volume. As will be explained in more detail below, the use of an assumed uniform distribution pseudo shim coil can be included in this procedure so as to increase the resulting uniformity (albeit with a possible offset in the final average value of the field).

Thereafter the newly calculated adjusted shim currents $AI_1 \ldots AI_n$ are actually applied to respective individual shim coils $S_1 \ldots S_n$ as depicted at 714 in FIG. 7. Thereafter, if the iteration count is less than some predetermined maximum as tested at 716, control is passed back to box 706 for another iteration of testing and possible auto-shimming. On the other hand, if the maximum number of iterations has been achieved (e.g., two or three), then control is passed to an operator interface at 718 for a manual decision as to whether the presently existing degree of homogeneity (which may require at least another repetition of acquisition step 706) has been achieved. If so, then a normal exit to conventionally acquire MRSI image data at 710 is made.

The calibration matrix itself is typically acquired only when significant changes are made to the magnetic system (e.g., upon initial set-up and construction of the apparatus or subsequent modifications to the equipment). The calibration matrix A contains members $A_{jk}$ representing a partial derivative of the magnetic field at voxel location j with respect to current changes in shim coil k. To obtain a calibration matrix for N shims, one exemplary procedure acquires N+1 proton MRSI images of a water phantom (which phantom preferably extends in the z direction considerably beyond the expected maximum image volume areas so as to eliminate end effect artifacts). The use of MRSI (rather than phase mapping or other related methods such as that of Prammer et al), is to be noted since MRSI is free of the position artifacts discussed earlier. Since calibration is infrequently performed, the relative slowness of MRSI is not disadvantageous here.

The first proton image in the calibration procedure is a reference which, for convenience, is typically made with the shim currents adjusted to values which give an approximately uniform field (e.g., after some conventional manual adjustments via 26 in FIG. 1). For each of the next N images, one of the shim coil currents is incremented above the nominal reference setting. By then subtracting the reference map from the map obtained with a given shim current having been incremented, the change in field at all voxels is obtained. When that change is divided by the magnitude of the current increment for that particular shim coil, the results are the calibration matrix entries $A_{jk}$.

Note that our calibration determines the shim coil fields by direct measurement by employing MRSI throughout the volume of interest, whereas O'Donnel et al. infer said shim fields from measurements on the surface of an imaginary sphere enclosing the volume of interest. This inference is made by fitting spherical harmonics to the fields measured on said surface.

In the exemplary embodiment, this procedure has been found satisfactory using only a single increment for the shim currents, since the fields at any given voxel will be linear with respect to shim coil current, and it is assumed the amplifiers providing the shim current are linear over the range employed. However, in principle, more measurements could be made to either verify such assumed linearity or to correct for any detected departure from linearity.

In the exemplary embodiment, we have also utilized only 8 of the 12 available shim coils (neglecting the $z^3$, $z^4$, $z^2x$, and $z^2y$ coils) since the four being neglected are of sufficiently high order that they do not appreciably alter the field over the typical image volumes of interest for human heads. Although the production of an entire calibration matrix is therefore a rather involved procedure, once such data is acquired, it only needs to be up-dated if the major equipment (e.g., digital-to-analog converters, amplifiers, etc.) or measurement grid coordinates are changed.

We have also discovered that some of the shim coils ($z^2$ in particular) can have a sizeable $B_z$ component. That is, incrementing the current in the $z^2$ shim coil causes a field change which behaves spatially as $z^2$ plus a constant offset. In principle, this is not a problem because the final average magnitude of the static field is not of principal concern so long as it is sufficiently uniform.

However, when the least squares fit algorithm is used for minimizing inhomogeneities, it necessarily attempts to adjust the field to some particular value (which we typically take to be its average over the shimming grid). Therefore, without an additional "constant offset" shim so as to counteract offsets of various actual shim coils, a least squares minimization algorithm will be restricted in its ability to adjust some of the shim coil currents (e.g., those which have substantial offset components).

Although physically, no such "constant offset" shim is used, the algorithm can be made to "think" that there is used such a shim coil by merely adding an extra column to the calibration matrix, each entry in the extra column being identical (e.g., one). In this manner, a "least squares" algorithm is then able to "counteract" any resulting constant offset components of the real shim fields by calculating an adjusted current for this fictitious pseudo-shim coil. The pseudo-shim here is preferred to an actual shim, the difficulties in using the latter being known to those in the imaging art.

As previously mentioned, although the result will be a slight constant shift or offset in the resultant average static field, this is of little concern since conventional MRI/MRSI procedures are capable of adjusting transmitted RF frequencies or other parameters of the system so as to adjust slice positions along the z-axis dimension to accommodate the actually encountered average field values.

As mentioned previously, one is free to choose the chemical species to be used for field mapping as fits one's convenience. For example, in brain the water signal is used, whereas for the extremities of the limbs the fat signal is preferred. In all subsequent discussions of exemplary embodiments we will assume the water signal has been chosen.

As depicted in FIG. 10, finding the precise location of water peaks in the frequency spectra may not always be as simple as merely finding a single peak and noting its location along the frequency axis. Rather, in human tissue there can be strong signals from fat as well—which is inherently shifted in frequency relative to water protons. Furthermore, in non-uniform areas (e.g., sinuses) the peaks may be very broad or split.

A "peak picking" algorithm is therefore required and one possible embodiment is depicted in more detail at FIG. 8. It will be appreciated that many types of "peak picker" algorithms per se are known in the spectrographic arts and many suitable ones can be envisioned of varying degrees of complexity and with varying operator interfaces so as to permit a human operator to make the choice for particular voxels if a difficulty is encountered. Nevertheless, the availability of the entire spectrum for mapping the B field inhomogeneity is a decided advantage in these instances (e.g., vis-a-vis a mere phase map representing the field as in Prammer et al).

Figure 8A:
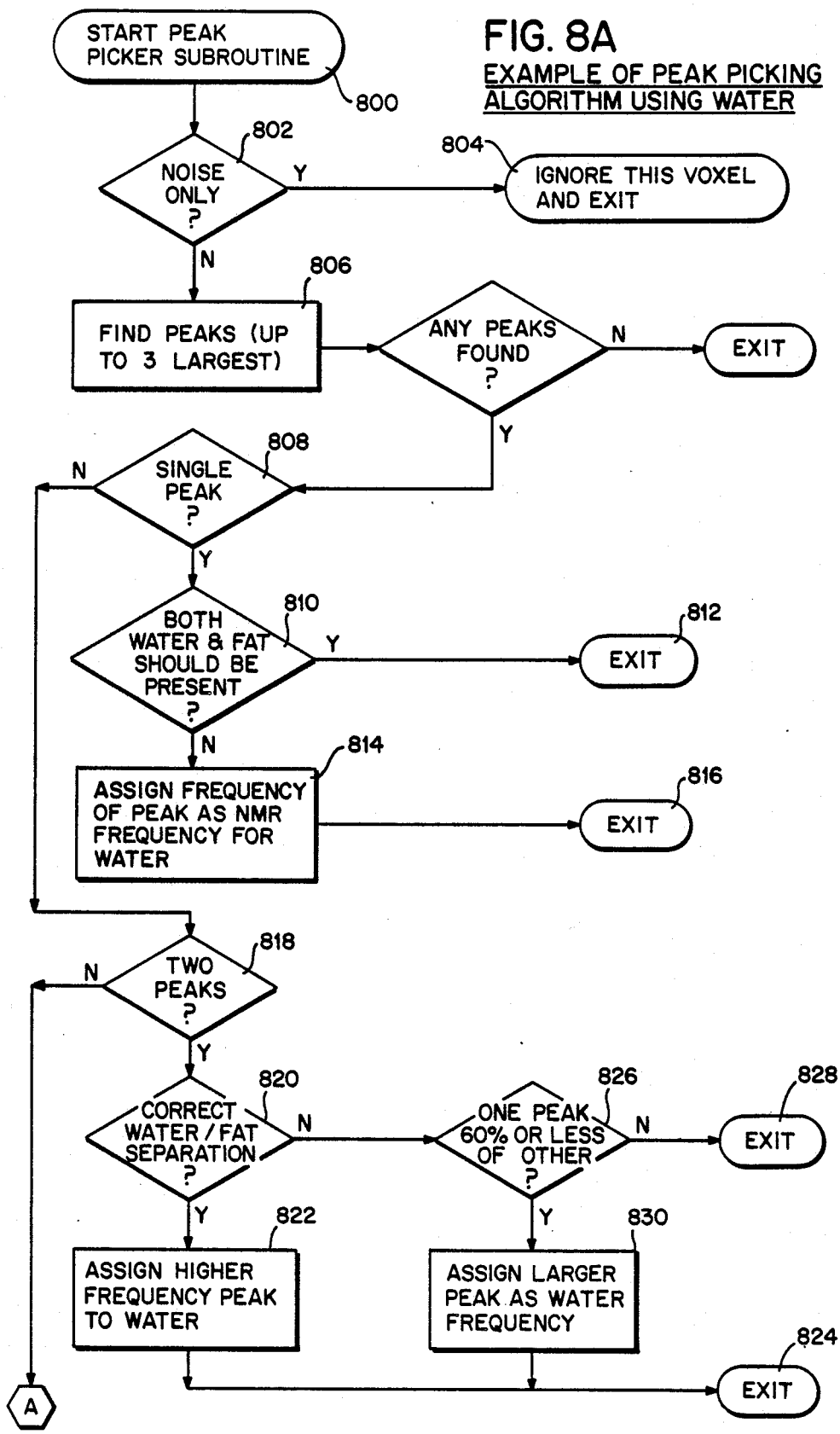
FIGS. 8A and 8B depict a flowchart providing a more detailed depiction of a "peak picker" subroutine of the type which might be used in the auto-shimming process of FIG. 7.
Figure 8B:
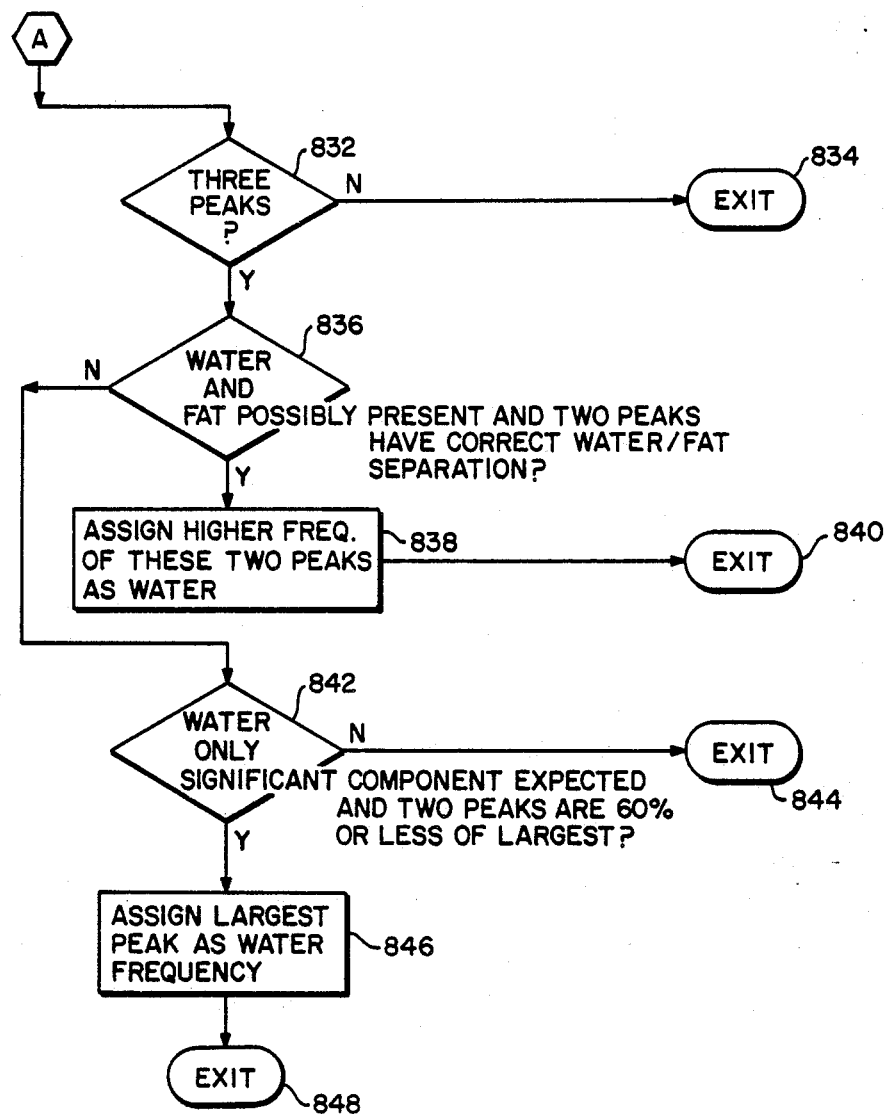

The exemplary peak picker subroutine is used as part of the acquisition step 706 in FIG. 7 and is entered at 800 in FIGS. 8A and 8B. A first decision is made at 802 as to whether there is even significant signal component present in a given voxel for further processing. If the voxel is determined to contain substantially only noise, then that particular voxel is ignored (i.e., it is not included in the auto-shimming program) and exit from the peak picker subroutine is taken at 804.

In one exemplary embodiment, separate reference levels are defined for "image" noise within a slice and "spectral" noise within a voxel. For example, the image noise reference level would simply be the value of average NMR responses from the four corner voxels of a given slice (e.g., all averaged together, assuming that the imaging field of view has been chosen such that these voxels typically contain only noise). Referring to points in the xy plane by voxel indices (rather than actual x,y dimension values), the corner voxels have coordinates (0,0), (0,15), (15,0), and (15,15). Unless the average NMR signal response for a given voxel is at least three times greater than the reference image noise as thus defined, the voxel is assumed to contain substantially only noise and is ignored at 802.

In the exemplary embodiment, the spectral noise reference level is defined as the image noise level divided by 256. It is used at step 806 in FIGS. 8A–8B to scan the spectrum for peaks. A point within the spectrum is considered to be a peak if it is at least two times larger than the reference spectral noise level and it is larger than the points on either side of it. A running tally of the locations and intensities of the three largest peaks (in order of decreasing intensity) is maintained as the spectrum data for a given voxel is scanned at 806.

The remainder of the flowchart in FIGS. 8A-8B represents an attempt to decide which, if any, of the discovered peaks is the water peak. If the water peak cannot be accurately ascertained automatically, then an operator interface may be used to make a decision. If no water peak data for a given voxel can be accurately identified then that voxel is simply discarded and not used in the auto-shimming process.

If only a single peak has been discovered, then a branch is taken at 808 and a test is made at 810 (based upon prior operator inputs) to see whether, for the tissue types involved, both water and fat peaks should have been found. If at least two peaks should have been present, then exit is again taken at 812 and this voxel is discarded from the auto-shimming program. However, if only a single peak is expected (e.g., as may be the case for purely brain tissue), then the recorded frequency of the peak is assigned as a relevant grid value for this voxel (representing the actual static magnetic field at this voxel site) before exit is taken at 816.

On the other hand, if more than a single peak has been found, a test is made at 818 to see if only two peaks were found. If so, then they are tested at 820 for the correct water/fat frequency separation. If the correct expected separation is discovered, then the higher frequency peak is assigned at 822 before normal exit is taken at 824. If an incorrect separation is discovered, then a test is made at 826 to see whether one of the peaks is 60% or less of the other. If not, then exit is taken at 828 without a frequency assignment for this voxel. On the other hand, if one of the peaks is sufficiently larger than the other, then the frequency of the largest peak is assigned to that voxel at 830 before exit is taken at 824.

If neither one nor two peaks has been discovered, then a test is made at 832 for three peaks. If three peaks have been discovered, then a test is made at 836 to see if any two of the peaks have the correct water/fat frequency separation. If so, then the higher frequency peak is assigned to this voxel at 838 and exit is taken at 840. If not, then a further test is made at 842 to see if one of the peaks is sufficiently larger than the other two. If not, then exit is taken at 844 without a frequency assignment for this voxel. However, if one of the peaks is sufficiently larger than the other two, then it is assigned as the proton frequency for this voxel at 846 before exit is taken at 848 from the peak picker subroutine.

It should be understood that the peak picker embodiment depicted in FIGS. 8A–8B, although a workable version, is not necessarily optimum. We continue to work on and modify the peak picker subroutine and those skilled in the art will no doubt find it similarly convenient to do the same.

As to the actual calculation of adjusted shim coil currents, the following explanation should be sufficient for those skilled in this art. Let the active image volume be divided into N voxels, and let the $B_o$ field at the kth voxel be $B_k(I)$, where the jth component of the vector I is the current in the jth shim. By Ampere's Law, B must depend linearly on I, through a matrix A which we define as $A_{kj} = B_k / I_j$. Let $I_o$ represent an initial set of shim currents, and define an average field as $<B(I_o)> = (1/N)\Sigma B_k(I_o)$. Then it can be shown by the method of least squares fitting, that the correction current $I = -(A^T A)^{-1} \Delta B$, where $\Delta B_k = B_k(I_o) - <B(I_o)>$. The process can be repeated taking $I_o + \Delta I$ as a new starting point.

In summary, in the exemplary embodiment, the operator is permitted to define the boundaries of the image volume to be shimmed (thus enabling the operator to avoid problem areas or areas outside the volume of interest). Then, only a subset of the available calibration matrix entries are used—i.e., only those corresponding to voxels which have identifiable water peaks and are also within the selected volume of interest (to thus form a smaller calibration matrix for use with the subset of selected voxels). In the exemplary embodiment, the acquired field map of magnetic field intensity inhomogeneities is then actually displayed for the operator (and/or the RMS variation may be calculated and displayed or printed out for the entire field over the region of interest). Subsequently, required changes in shim coil currents for minimizing such RMS variation are, upon operator approval, automatically calculated and sent to the digital-to-analog convertors controlling the actual shim currents.

Figure 12:
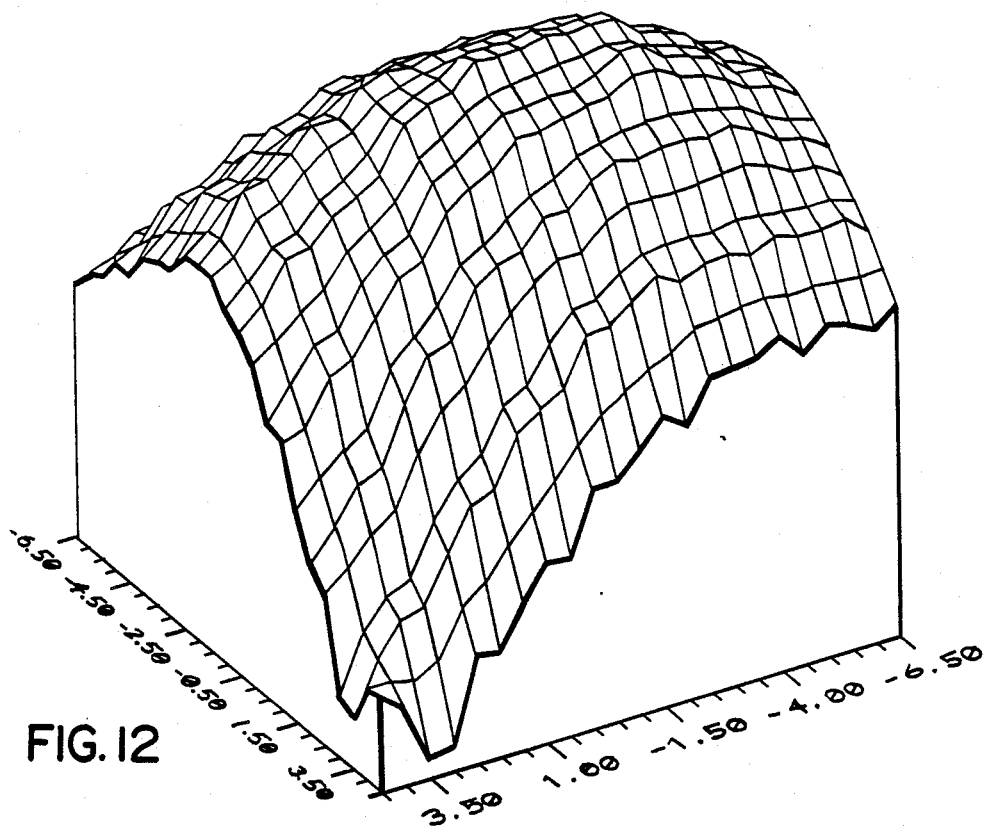
FIG. 12 is a field map of the center slice of a water phantom before the auto-shimming process of this invention has been applied.
Figure 13:
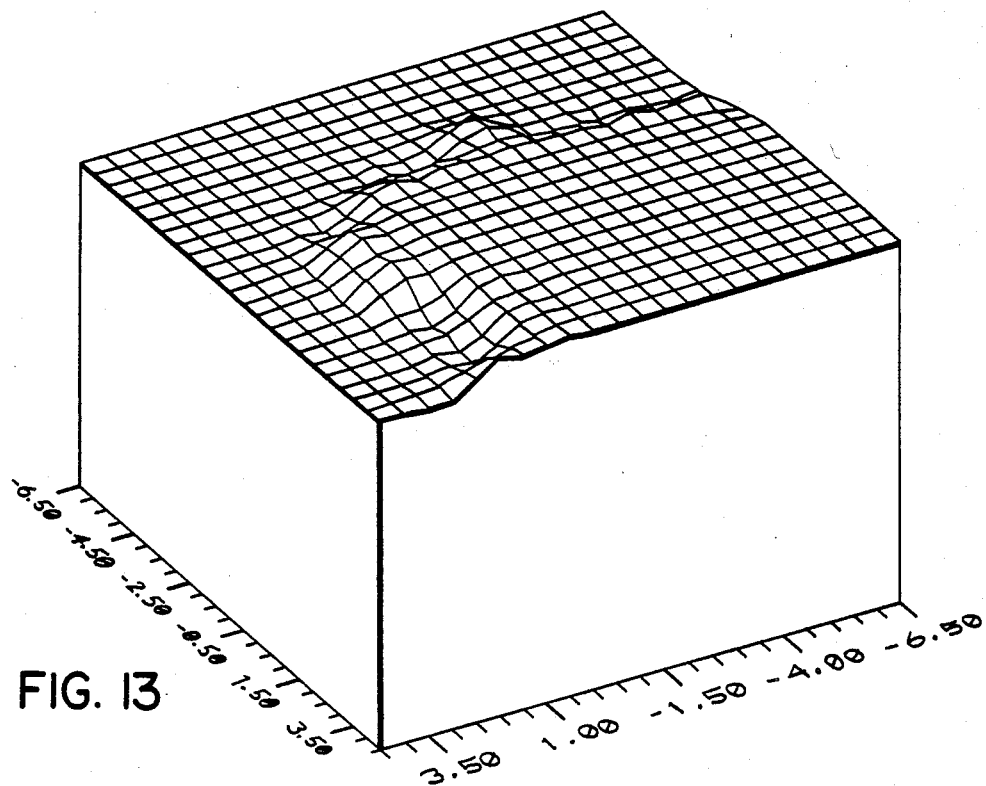
FIG. 13 is a field map of the same phantom center slice after a single iteration of auto-shimming in accordance with this invention.

The auto-shimming procedure of this invention gives excellent results with both large water phantoms and actual human heads. FIGS. 12 and 13 show a field map of the center of a water phantom. FIG. 12 shows the field map before auto-shimming and with a vertical scale corresponding to about 2 ppm field variation from top to bottom (horizontal scales are in centimeters). FIG. 13 shows a similar map after a single iteration of auto-shimming in accordance with this invention. (Horizontal and vertical scales being the same as those used in FIG. 12). As can be seen from FIGS. 12 and 13, field uniformity has been dramatically improved after only a single iteration of auto-shimming. We have typically achieved a level of about 0.1 ppm RMS field variation over typical shimming volumes of about 1 liter after only one or two iterations. Since points in the frequency spectra of the exemplary embodiment are only measured at 10 Hz intervals, this is roughly the limit of B field measurement resolution possible in the exemplary system.

We have also performed several phosphorus MRSI scans of human heads using the auto-shimming system of this invention in which the procedure has again performed quite well. We have found best results with two iterations of the procedure although the first iteration makes most of the needed correction. Each iteration presently takes approximately takes 15 minutes although substantial reductions of this time may be obtained in the future (e.g., by using a single spin echo instead of a two-average).

With the field nominally shimmed, we have found that placing a live human subject in the field and mapping three transaxial slices through the brain produces a measured RMS field variation of roughly 0.5 to 1.0 ppm. After a single iteration of the auto-shim procedure, the variation typically drops to about 0.2 to 0.3 ppm and after a second iteration, to approximately 0.15 to 0.2 ppm.

Figure 15:
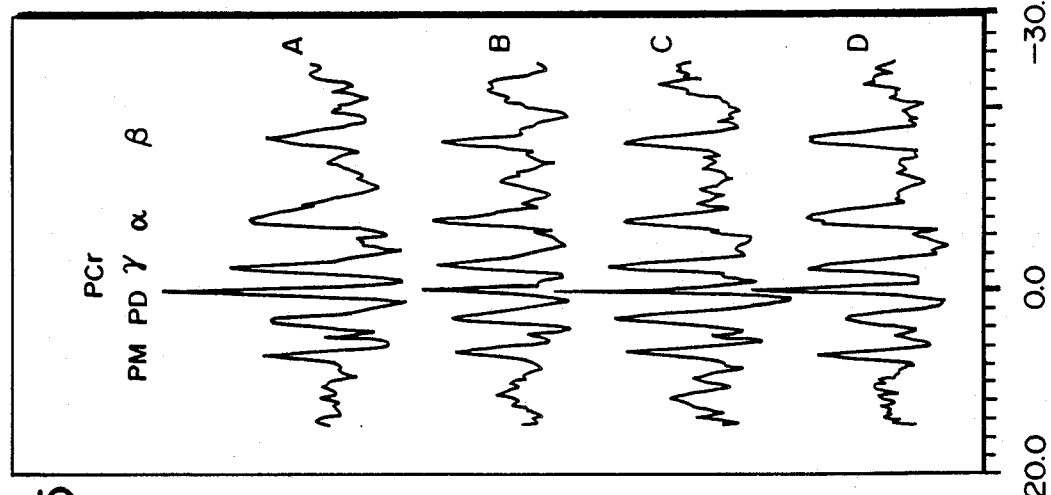
FIG. 15 shows similar spectra from a phosphorus MRSI scan of human brain after two iterations of auto-shimming in accordance with this invention.
Figure 14:
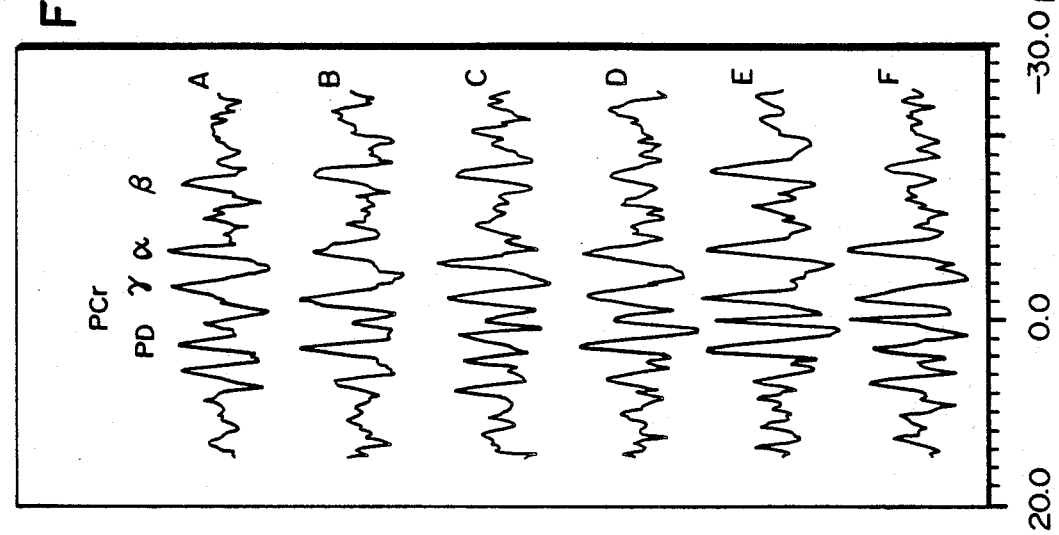
FIG. 14 shows a sequence of spectra from a phosphorus MRSI scan of human brain after laborious manual shimming.

The improvement produced in measured phosphorus spectra using auto-shimming procedures in accordance with this invention is quite dramatic as evidenced by FIGS. 14 and 15. FIG. 14 shows spectra from our best available phosphorus scan prior to implementation of auto-shimming. FIG. 15 shows similar spectra obtained after auto-shimming in accordance with this invention. As will be seen, the signal-to-noise ratio is greatly improved thus enabling a much more accurate determination of NMR peaks. Furthermore, even though two iterations of auto-shimming were used for making the measurements depicted in FIG. 15, the total time required for the MRSI scan of FIG. 15 was actually less than the time required to obtain the scan of FIG. 14 (using manual shimming techniques).

It may also be possible to create the required calibration matrix by measuring shim coil B field distributions using a mechanical field plot arrangement rather than MRSI. This may permit more precise measurement of the actual field strengths— however, insuring that the calibration measurement grid coincides with the MRSI field map grid used in the auto-shimming procedure would then be more difficult. Some interpolation procedures might, for example, be necessary to conform the calibration matrix points with the MRSI measurement grid map coordinates before calculation of adjusted shim coil currents could be accurately be made.

As already noted, there may in fact be some non-linearities in the differential fields produced by a shim coil (e.g., perhaps due to non-linearities in the digital-to-analog converters or the like). By using a more elaborate multi-increment measurement during the calibration procedure, one could actually measure and correct for any such non-linearities in the calibration matrix.

If homogeneity is of more concern in a portion of the image volume, then one could also weight those portions of the image volume more heavily in the least squares fit algorithm. Operationally one would minimize $\Sigma_j W_j^2 (\Delta B_j + A_{jk}\Delta I_k)^2$, where $W_j$ is the weight of the $j^{th}$ grid point. This would be accomplished within our present system by the transformations $\Delta B_j \rightarrow W_j \Delta B_j$ and $A_{jk} \rightarrow W_j A_{jk}$.

The spectra of FIGS. 14 and 15 were obtained using the chemical shift imaging method of Brown et al. (Proceedings National Academy of Sciences, US Vol. 79, page 3253, 1982) from a voxel of 27 cubic centimeters using 34 minutes of acquisition time with a TR parameter of 4 seconds.

As will be appreciated, there are a wide variation of NMR species which may be subjected to MRSI. For example, in addition to $^{31}P$, there are other nuclei like $^{13}C$ and $^{23}Na$ and others which will be clearly recognized by those in the art.

Although only one exemplary embodiment of this invention has been explained in detail, those skilled in the art will recognize that there are many possible variations and modifications which may be made in this exemplary embodiment while yet retaining many of the novel features and advantages of this invention. Accordingly, all such variations and modifications are intended to be included within the scope of the appended claims.

WHAT IS CLAIMED IS

1. A method for adjusting currents in plural magnetic shim coils in an MRI/MRSI system comprising the steps of:
    (a) mapping an existing magnetic field distribution;
    (b) machine calculating an adjusted set of currents for actual shim coils to improve uniformity of field distribution while also using in such calculation an assumed uniformly distributed fictitious pseudo shim coil which does not actually exist thereby permitting uniform offset adjustments to be included in the calculations; and
    (c) applying said adjusted set of currents to the actual shim coils.

2. A method for adjusting currents in plural magnetic shim coils in an MRI/MRSI system comprising the steps of:
    (a) acquiring an MRI image of a patient volume;
    (b) defining a desired MRSI image volume therewithin; and
    (c) automatically shimming a static magnetic field within the defined MRSI image volume by mapping the existing field distribution and calculating and applying adjusted shim coil currents to improve the homogeneity of the thus mapped distribution, including the step of using in such calculation an assumed uniformly distributed fictitious pseudo shim coil which does not actually exist thereby permitting uniform offset adjustments to be included in the calculations.

3. A method of automated shimming of static magnetic fields for homogeneity in an MRSI system comprising:
    (a) acquiring and using NMR spin echo responses to create NMR spectral responses from plural voxels within an image area and a map of existing magnetic field variation therewithin corresponding to the NMR spectral peak frequency of a predetermined NMR species and using same to automatically reduce said variations; and
    (b) thereafter acquiring and using NMR FID responses to create MRSI plots of other NMR species from said image area.

4. A method of automated shimming of static magnetic fields for homogeneity in an MRSI system comprising:
    (a) mapping the distribution of incremental magnetic field change for unit current to create a calibration value matrix for each of plural magnetic shim coils over a predetermined array of voxels;
    (b) mapping and recording variations in existing static magnetic field distribution for only some of said voxels;
    (c) using said recorded variations and a subset of said calibration value matrix corresponding to only some of said voxels to calculate adjusted shim coil currents required to reduce the magnitude of said variations, including the step of using in such calculation an assumed uniformly distributed fictitious pseudo shim coil which does not actually exist thereby permitting uniform offset adjustments to be included in the calculations; and
    (d) applying said adjusted shim coil currents to respectively corresponding shim coils.

5. A multiply-tuned RF coil for use in magnetic resonance spectroscopic imaging, said coil comprising:
    multiple pairs of resonant Helmholtz coils, the coils in each pair being capacitively over coupled to one another; and
    plural adjustably positionable loading and coupling loops, one of said loops being inductively coupled to each of said Helmholtz pairs and feed-connected to a respectively associated separate RF transmission line.

6. A multiply-tuned RF coil as in claim 5 further comprising:
    a frequency multiplexer comprising a plurality of band-pass/band-stop filters individually connected at one end to a respectively corresponding one of said transmission lines and commonly connected together at their other ends to a common RF input-/output port.

7. A method for adjusting currents in plural magnetic shim coils in a magnetic resonance imaging system, said method comprising the steps of
    (a) mapping the distribution of a static magnetic field B within an imaging volume with a first set of currents $I_1 \ldots I_n$ in shim coils $S_1 \ldots S_n$ by magnetic resonance spectroscopy which maps the frequency of a predetermined NMR species at an array of locations within said imaging volume;
    (b) machine calculating an adjusted second set of shim coil currents $AI_1 \ldots AI_n$ using a calibration matrix of incremental B field distributions produced by the individual shim coils and the measured existing B field distribution so as to minimize variations in the B field distribution; and (c) applying said adjusted shim coil currents $AI_1 \ldots AI_n$ to respectively corresponding shim coils $S_1 \ldots S_n$.

8. A method as in claim 7 further comprising, after said applying step(c);
   (d) again performing said mapping step;
   (e) comparing the resulting uniformity of said B field distribution to a predetermined maximum permissible magnitude of variation; and
   (f) if said predetermined maximum is exceeded, repeating steps (b) and (c).

9. A method as in claim 8 wherein said predetermined maximum corresponds to 0.2 ppm or less.

10. A method as in claim 7 wherein, prior to step (a), at least one magnetic resonance image is created to define the imaging volume over which the B field distribution is to be shimmed for uniformity.

11. A method as in claim 7 which is performed while a living patient is located at least partially within said imaging volume.

12. A method as in claim 11 further comprising:
   thereafter taking magnetic resonance spectrographic imaging (MRSI) data on additional NMR species of nuclei without moving said patient from said imaging volume.

13. A method as in claim 12 wherein all magnetic resonance data used therein is obtained using a multiply-tuned set of RF coils coupled to the imaging volume.

14. A method as in claim 7 wherein said predetermined NMR species of nuclei comprises hydrogen nuclei.

15. A method as in claim 7 wherein all magnetic resonance data used therein is obtained from NMR spin echoes and not from FID NMR responses.

16. A method as in claim 7 further comprising generating said calibration matrix by
   (i) individually changing the current flowing in each of said shim coils; and
   (ii) measuring and recording the resulting distribution of the incremental changes in the B field per unit current.

17. A method as in claim 7 wherein step (b) is performed including a non-existent pseudo shim coil $S_p$ having an assumed uniform incremental B field distribution and calculating a corresponding pseudo-current $I_p$ which produces a uniform offset in the actual B field but with resulting improved uniformity thereof.

18. In a magnetic resonance spectrographic imaging (MRSI) system having shim coils $S_1 \ldots S_n$ for adjusting the uniformity of a nominally static magnetic field $B_o$ within an image volume, the improvement comprising:
   first means for generating a map array of magnetic resonance spectrographic data representing actual $B_o$ intensity at corresponding locations within said image volume; and
   second means for using said spectrographic data to generate and supply adjusted shim currents $I_1 \ldots I_n$ to shim coils, $S_1 \ldots S_n$ to make $B_o$ intensity substantially more uniform within the image volume, including means for performing calculations using an assumed uniformly distributed fictitious pseudo shim coil which does not actually exist thereby permitting uniform offset adjustments to be included in the calculations.

19. In a magnetic resonance spectrographic imaging (MRSI) system having shim coils $S_1 \ldots S_n$ for adjusting the uniformity of a nominally static magnetic field $B_o$ within an image volume, the improvement comprising:
   first means for generating a map array of magnetic resonance spectrographic data representing actual $B_o$ intensity at corresponding locations within said image volume; and
   second means for using said spectrographic data to generate and supply adjusted shim currents $I_1 \ldots I_n$ to shim coils, $S_1 \ldots S_n$ to make $B_o$ intensity substantially more uniform within the image volume,
   wherein said first means generated NMR spin echoes in an MRSI sequence which includes two degrees of phase encoding with magnetic gradient pulses and three degrees of Fourier Transformation to produce spectrographic data representing the NMR frequency of hydrogen nuclei at said locations.

20. An improved MRSI system as in claim 18 wherein said calculation performing means generates a pseudo-current value $I_{n+1}$ for a fictitious pseudo-shim coil $S_{n+1}$ which is assumed to have the ability to add a uniform offset to $B_o$ within said image volume thereby causing the adjusted actual shim currents $I_1 \ldots I_{n\,pl\,to}$ *produce a more uniform actual $B_o$* within said image volume.

21. An improved MRSI system as in claim 18 further comprising:
   means for generating a calibration map of magnetic resonance spectrographic data representing differential shim coil contributions to $B_o$ per unit current at corresponding locations within said image volume for each of plural shim coils; and
   wherein said second means utilizes said calibration maps to generate the adjusted shim currents using an approximated best fit algorithm.

22. In a magnetic resonance spectrographic imaging (MRSI) system having shim coils $S_1 \ldots S_n$ for adjusting the uniformity of a nominally static magnetic field $B_o$ within an image volume, the improvement comprising:
   first means for generating a map array of magnetic resonance spectrographic data representing actual $B_o$ intensity at corresponding locations within said image volume;
   second means for using said spectrographic data to generate and supply adjusted shim currents $I_1 \ldots I_n$ to shim coils $S_1 \ldots S_n$ to make $B_o$ intensity substantially more uniform within the image volume; and
   means for generating a calibration map of magnetic resonance spectrographic data representing differential shim coil contributions to $B_o$ per unit current at corresponding locations within said image volume for each of plural shim coils,
   wherein said second means utilizes said calibration maps to generate the adjusted shim currents using an approximated best fit algorithm, and said approximated best fit algorithm comprises at least squares fit of $B_o$+shim coils fields to a uniform spatial distribution within said image volume using said adjusted shim currents $I_1 \ldots I_n$ and said calibration maps.

23. An improved MRSI system as in claim 21 wherein said means for generating calibration maps includes a phantom positioned within said image volume and extending substantially therebeyond in the direction of $B_o$.

24. In a magnetic resonance spectrographic imaging (MRSI) system having shim coils $S_1 \ldots S_n$ for adjusting the uniformity of a nominally static magnetic field $B_o$ within an image volume, the improvement comprising:
- first means for generating a map array of magnetic resonance spectrographic data representing actual $B_o$ intensity at corresponding locations within said image volume; and
- second means for using said spectrographic data to generate and supply adjusted shim currents $I_1 \ldots I_n$ to shim coils $S_1 \ldots S_n$ to make $B_o$ intensity substantially more uniform within the image volume;
- wherein said first means generates spectrographic data for each said location which includes measured NMR response versus NMR frequency data and includes an automated peak-picker program for selecting a predetermined NMR species response peak frequency as the spectrographic data representing $B_o$ intensity at a corresponding location.

25. In a magnetic resonance spectrographic imaging (MRSI) system having shim coils $S_1 \ldots S_n$ for adjusting the uniformity of a nominally static magnetic field $B_o$ within an image volume, the improvement comprising:
- first means for generating a map array of magnetic resonance spectrographic data representing actual $B_o$ intensity at corresponding locations within said image volume; and
- second means for using said spectrographic data to generate and supply adjusted shim currents $I_1 \ldots I_n$ to shim coils $S_1 \ldots S_n$ to make $B_o$ intensity substantially more uniform within the image volume;
- wherein said first means uses multiple phase encoding and multiple Fourier Transformations without any applied frequency encoding magnetic gradient during the reading of NMR signal responses to produce said spectrographic data.

26. In a magnetic resonance spectrographic imaging (MRSI) system having shim coils $S_1 \ldots S_n$ for adjusting the uniformity of a nominally static magnetic field $B_o$ within an image volume, the improvement comprising:
- first means for generating a map array of magnetic resonance spectrographic data representing actual $B_o$ intensity at corresponding locations within said image volume; and
- second means for using said spectrographic data to generate and supply adjusted shim currents $I_1 \ldots I_n$ to shim coils, $S_1 \ldots S_n$ to make $B_o$ intensity substantially more uniform within the image volume,
- wherein said first means elicits NMR echo responses and generates said spectrographic data therefrom.

27. In a magnetic resonance spectrographic imaging (MRSI) system having shim coils $S_1 \ldots S_n$ for adjusting the uniformity of a nominally static magnetic field $B_o$ within an image volume, the improvement comprising:
- first means for generating a map array of magnetic resonance spectrographic data representing actual $B_o$ intensity at corresponding locations within said image volume; and
- second means for using said spectrographic data to generate and supply adjusted shim currents $I_1 \ldots I_n$ to shim coils, $S_1 \ldots S_n$ to make $B_o$ intensity substantially more uniform within the image volume,
- wherein said first means comprises a multiple-tuned RF coil structure including plural pairs of resonant Helmholtz coils capacitively coupled to each other and individually tuned to resonate for a respectively corresponding NMR species.

28. An improved MRSI system as in claim 27 wherein said first means comprises:
- a frequency multiplexer including plural band-pass/band-stop filters connected to combine resonant NMR signals of plural frequencies from said resonant coil pairs onto a common input/output port while still isolating each resonant coil pair from other coil pair(s); and
- a frequency selective transmit/receive switch means connecting said common input/output port to RF signal transmitting and receiving circuits.

29. An improved MRSI system as in claim 28 wherein said transmit/receive switch means includes an RF transmission line approximately equal to an odd multiple of a quarter wavelength for RF signals emanating from plural species of NMR nuclei.

30. In a magnetic resonance spectrographic imaging (MRSI) system having shim coils $S_1 \ldots S_n$ for adjusting the uniformity of a nominally static magnetic field $B_o$ within an image volume, the improvement comprising:
- first means for generating a map array of magnetic resonance spectrographic data representing actual $B_o$ intensity at corresponding locations within said image volume;
- second means for using said spectrographic data to generate and supply adjusted shim currents $I_1 \ldots I_n$ to shim coils, $S_1 \ldots S_n$ to make $B_o$ intensity substantially more uniform within the image volume; and
- means for generating a locator image using phase and frequency encoded NMR signals from a predetermined single species of NMR nuclei to define the image volume to be shimmed for more uniform $B_o$.

31. A magnetic resonance spectroscopic imaging (MRSI) system comprising:
- RF coils tuned to resonate at plural frequencies $f_1$ and $f_2$ and adapted to couple RF signals at such frequencies to/from an object to be imaged;
- RF signal transmit and receive circuits coupled (a) to transmit RF signals at said plural frequencies to said RF coils and (b) to receive RF signals at said plural frequencies from said RF coils;
- a main magnet for generating a nominally static magnetic field $B_o$ throughout a predetermined image volume;
- plural shimming magnet coils $S_1 \ldots S_n$ for controllably adjusting the uniformity of said static magnetic field $B_o$ by passing adjusted shim currents $AI_1 \ldots AI_n$ through the corresponding shim coils $S_1 \ldots S_n$;
- magnetic gradient coils Gx, Gy, Gz for controllably generating respective gradients in the magnetic field $B_o$,
- control means connected to control sequences of RF signal transmission and reception in conjunction with magnetic gradient pulses to generate MRSI image data;
- said control means including shim control means which:
  - (1) generates a map of spectrographic data representative of actual $B_o$ intensity within said image volume;
  - (2) generates corrective shim current values $AI_1 \ldots AI_n$ based on said spectrographic data for making $B_o$ intensity more uniform; and (3) adjusts the shim current values accordingly so as to make $B_o$ intensity substantially more uniform prior to generation of said MRSI image data.

32. An MRSI system as in claim 31 further comprising an RF transmitter/receiver isolation circuit including:
an RF transmission line connected between the RF transmitter and receiver circuit and having an effective length which is simultaneously approximately equal to an odd multiple of quarter wavelengths for plural NMR species of nuclei, and
a PIN shunt diode and associated biasing circuit for selectively short circuiting the end of said line nearest the receiver circuits.

33. An MRSI system as in claim 32 further comprising:
a second RF transmission line connected serially between the first mentioned line and said receiver circuit and having an effective length less than 0.2 wavelength at all received NMR frequencies;
a second PIN shunt diode for selectively short circuiting the end of said line nearest the receiver circuits.

34. Apparatus for adjusting currents in plural magnetic shim coils in an MRI/MRSI system comprising:
(a) means for mapping an existing magnetic field distribution;
(b) means for machine calculating an adjusted set of currents for actual shim coils to improve uniformity of field distribution while also using, in such calculation a fictitious, assumed uniformly distributed pseudo-shim coil which does not actually exist thereby permitting uniform offset adjustments to be included in the calculations; and
(c) means for applying said adjusted set of currents to the actual shim coils.

35. Apparatus for adjusting currents in plural magnetic shim coils in an MRI/MRSI system comprising:
(a) means for acquiring an MRI image of a patient volume;
(b) means for defining a desired MRSI image volume therewithin; and
(c) means for automatically shimming a static magnetic field within the defined MRSI image volume by mapping the existing field distribution and calculating and applying adjusted shim coil currents to improve the homogeneity of the thus mapped distribution, including means for performing calculations using an assumed uniformly distributed fictitious pseudo shim coil which does not actually exist thereby permitting uniform offset adjustments to be included in the calculations.

36. Apparatus for automated shimming of static magnetic fields for homogeneity in an MRSI system comprising:
(a) means for acquiring and using NMR spin echo responses to create NMR spectral responses from plural voxels within an image area and a map of existing magnetic field variation therewithin corresponding to the NMR spectral peak frequency of a predetermined NMR species and using same to automatically reduce said variations; and
(b) means for thereafter acquiring and using NMR FID or spin echo responses to create MRSI plots of other NMR species from said image area.

37. Apparatus for automated shimming of static magnetic fields for homogeneity in an MRSI system comprising:
(a) means for mapping the distribution of incremental magnetic field change per unit current to create a calibration value matrix for each of plural magnetic shim coils over a predetermined array of voxels, including means for generating spectrographic data for each voxel which includes measured NMR response versus NMR frequency data, including automated peak-picking means for selecting a predetermined NMR species response peak frequency as the spectrographic data representing $B_o$ intensity within a corresponding voxel;
(b) means for mapping and recording variations in existing static magnetic field distribution for only some of said voxels;
(c) means for using said recorded variations and a subset of said calibration value matrix corresponding to only some of said voxels to calculate adjusted shim coil currents required to reduce the magnitude of said variations; and
(d) means for applying said adjusted shim coil currents to respectively corresponding shim coils.

38. Apparatus for adjusting currents in plural magnetic shim coils in a magnetic resonance imaging system, said apparatus comprising:
(a) means for mapping the distribution of a static magnetic field B within an imaging volume with a first set of currents $I_1 \ldots I_n$ in shim coils $S_1 \ldots S_n$ by magnetic resonance spectroscopy which maps the frequency of a predetermined NMR species at an array of locations within said imaging volume, including means for generating spectrographic data for each voxel which includes measured NMR response versus NMR frequency data, including automated peak-picking means for selecting a predetermined NMR species response peak frequency as the spectrographic data representing $B_o$ intensity within a corresponding voxel;
(b) means for machine calculating an adjusted second set of shim coil currents $AI_1 \ldots AI_n$ using a calibration matrix of field distributions produced by the individual shim coils and the measured existing B field distribution so as to minimize variations in the B field distribution; and
(c) means for applying said adjusted shim coil currents $AI_1 \ldots AI_n$ to respectively corresponding shim coils $S_1 \ldots S_n$.

39. Apparatus as in claim 38 further comprising,
(d) means for again performing said mapping step;
(e) means for comparing the resulting uniformity of said B field distribution to a predetermined maximum permissible magnitude of variation; and
(f) means for repeating steps (b) and (c) if said predetermined maximum is exceeded.

40. Apparatus as in claim 38 further comprising means for creating at least one magnetic resonance image to define the imaging volume over which the B field distribution is to be shimmed for uniformity.

41. Apparatus as in claim 38 wherein:
said mapping means includes means for mapping said field distribution while a patient is disposed within said imaging volume;
said calculating means and said applying means each operate while said patient is disposed within said imaging volume; and said apparatus further comprises means for taking magnetic resonance spectrographic imaging (MRSI) data on additional NMR species of nuclei without moving said patient from said imaging volume after said shim currents have been adjusted.

42. Apparatus as in claim 41 wherein said means for mapping comprises a multiply-tuned set of RF coils coupled to the imaging volume.

43. Apparatus as in claim 38 wherein said means for calculating includes means for including a fictitious non-existent pseudo-shim coil $S_p$ having an assumed uniform incremental B field distribution and for calculating a corresponding pseudo-current $I_p$ which produces a uniform offset in the actual B field but with resulting improved uniformity.

44. A method as in claim 2 wherein said shimming step (c) includes the step of generating spectrographic data including measured NMR response versus NMR frequency data for each of plural voxels within said patient volume, and automatically picking peak spectrographic responses by selecting a predetermined NMR species response peak frequency as the spectrographic data representing $B_o$ intensity within a corresponding voxel.

45. A method as in claim 4 wherein said mapping step (a) includes the steps of:
   (i) generating spectrographic data including measured NMR response versus NMR frequency data for each of said voxels, and
   (ii) automatically picking peak spectrographic responses by selecting a predetermined NMR species response peak frequency as the spectrographic data representing $B_o$ intensity within a corresponding voxel.

46. An improved MRSI system as in claim 18 wherein said first means includes:
   means for generating spectrographic data including measured NMR response versus NMR frequency data for each of said voxels, and
   means operatively coupled to said spectrographic data generating means for automatically picking peak spectrographic responses by selecting a predetermined NMR species response peak frequency as the spectrographic data representing $B_o$ intensity within a corresponding voxel.

47. Apparatus as in claim 35 wherein said shimming means includes:
   means for generating spectrographic data including measured NMR response versus NMR frequency data for each of a plurality of voxels within said patient volume, and
   means operatively coupled to said spectrographic data generating means for automatically picking peak spectrographic response by selecting, for each of a subset of said plurality of voxels, a predetermined NMR species response peak frequency as the spectrographic data representing $B_o$ intensity within said corresponding subset of voxels.

* * * * *